(12) United States Patent
Yamaguchi

(10) Patent No.: US 9,704,875 B2
(45) Date of Patent: Jul. 11, 2017

(54) MANUFACTURING METHOD OF SEMICONDUCTOR DEVICE

(71) Applicant: Renesas Electronics Corporation, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/259,502

(22) Filed: Sep. 8, 2016

(65) Prior Publication Data

US 2017/0069648 A1    Mar. 9, 2017

(30) Foreign Application Priority Data

Sep. 9, 2015 (JP) ................. 2015-177222

(51) Int. Cl.

| H01L 27/115 | (2017.01) |
|---|---|
| H01L 27/11568 | (2017.01) |
| H01L 29/45 | (2006.01) |
| H01L 21/3105 | (2006.01) |
| H01L 29/66 | (2006.01) |
| H01L 21/285 | (2006.01) |
| H01L 21/321 | (2006.01) |
| H01L 21/28 | (2006.01) |
| H01L 27/11521 | (2017.01) |
| H01L 29/423 | (2006.01) |

(52) U.S. Cl.
CPC .. *H01L 27/11568* (2013.01); *H01L 21/28273* (2013.01); *H01L 21/28282* (2013.01); *H01L 21/28518* (2013.01); *H01L 21/31055* (2013.01); *H01L 21/3212* (2013.01); *H01L 27/11521* (2013.01); *H01L 29/42328* (2013.01); *H01L 29/42344* (2013.01); *H01L 29/45* (2013.01); *H01L 29/665* (2013.01); *H01L 29/66545* (2013.01); *H01L 29/66825* (2013.01); *H01L 29/66833* (2013.01)

(58) Field of Classification Search
CPC .......... H01L 27/11568; H01L 27/1157; H01L 29/665; H01L 29/66507
See application file for complete search history.

(56) References Cited

U.S. PATENT DOCUMENTS

| 2014/0227843 A1 | 8/2014 | Tsukamoto et al. | |
| 2016/0043098 A1* | 2/2016 | Nakanishi | H01L 27/11573 |
| | | | 438/283 |

FOREIGN PATENT DOCUMENTS

JP    2014-154790 A    8/2014

* cited by examiner

*Primary Examiner* — Daniel Shook
(74) *Attorney, Agent, or Firm* — Mattingly & Malur, PC

(57) ABSTRACT

When upper surfaces of a control gate electrode and a memory gate electrode are exposed from an interlayer insulating film by polishing the interlayer insulating film in a gate last process, a silicide layer covering the upper surfaces of the gate electrodes is formed. Thereafter, by reacting a metal film deposited on the silicide layer with the control gate electrode and the memory gate electrode, a silicide layer thicker than the former silicide layer is formed on each of the gate electrodes.

12 Claims, 28 Drawing Sheets

FIG. 28

| | OPERATION METHOD WRITE/ERASE | WRITING OPERATION VOLTAGE (V) Vmg/Vs/Vcg/Vd/Vb | ERASING OPERATION VOLTAGE (V) Vmg/Vs/Vcg/Vd/Vb | READING OPERATION VOLTAGE (V) Vmg/Vs/Vcg/Vd/Vb |
|---|---|---|---|---|
| A | SSI(WRITE)/BTBT(ERASE) | 10/5/1/0.5/0 | -6/6/0/open/0 | 0/0/1.5/1.5/0 |
| B | SSI(WRITE)/FN(ERASE) | 10/5/1/0.5/0 | 12/0/0/0/0 | 0/0/1.5/1.5/0 |
| C | FN(WRITE)/BTBT(ERASE) | -12/0/0/0/0 | -6/6/0/open/0 | 0/0/1.5/1.5/0 |
| D | FN(WRITE)/FN(ERASE) | -12/0/0/0/0 | 12/0/0/0/0 | 0/0/1.5/1.5/0 |

MANUFACTURING METHOD OF SEMICONDUCTOR DEVICE

CROSS-REFERENCE TO RELATED APPLICATION

The present application claims priority from Japanese Patent Application No. 2015-177222 filed on Sep. 9, 2015, the content of which is hereby incorporated by reference into this application.

TECHNICAL FIELD OF THE INVENTION

The present invention relates to a manufacturing method of a semiconductor device and can be applied to, for example, the manufacture of a semiconductor device having a silicide layer.

BACKGROUND OF THE INVENTION

A transistor including a metal gate electrode and a high dielectric constant film (high-k film) has been known as a transistor to be formed in a logic unit of a next-generation microcomputer capable of miniaturization. As a method of forming such a transistor, a so-called gate last process has been known in which a dummy gate electrode is first formed on a substrate and the dummy gate electrode is then replaced by a metal gate electrode.

Moreover, as an electrically rewritable and erasable nonvolatile semiconductor storage device, a memory cell having a conductive floating gate electrode or a trapping insulating film surrounded by an oxide film under a gate electrode of a MISFET has been widely used. As a nonvolatile semiconductor storage device using a trapping insulating film, a MONOS (Metal Oxide Nitride Oxide Semiconductor) split gate cell has been known.

In the gate last process, elements are covered with an interlayer insulating film after forming a silicide layer on source/drain regions of each kind of MISFET, and an upper surface of the interlayer insulating film is then polished so that an upper surface of a gate electrode is exposed. For this reason, in the case in which a silicide layer is formed on a gate electrode constituting a memory cell and made of a semiconductor film, the process of forming the silicide layer needs to be carried out again after the polishing process.

In this case, when the silicide layer is formed on the upper surface of the gate electrode constituting the memory cell after the polishing process, a metal film is first deposited on the upper surface of the gate electrode by, for example, a sputtering method, and silicon forming the gate electrode is then reacted with the metal film to form the silicide layer.

In the technique described in the Patent Document 1 (Japanese Patent Application Laid-Open Publication No. 2014-154790), in the case of mounting a memory cell and a MISFET of a logic unit in a mixed manner, a silicide layer on the source/drain regions of the MISFET is first formed, a metal gate electrode of the MISFET is formed by the gate last process, and a silicide layer is then formed on the gate electrode of the memory cell.

SUMMARY OF THE INVENTION

When a metal film is to be deposited on the gate electrode by a sputtering method in order to form a silicide layer, metal molecules collide with an upper surface of the gate electrode in the sputtering process and silicon forming the gate electrode scatters around the gate electrode in some cases. Moreover, after the metal film is deposited, silicon of the upper surface of the gate electrode diffuses in the metal film in some cases.

When a silicidation process is carried out in these cases, silicide layers which are formed on upper surfaces of a control gate electrode and a memory gate electrode that constitute a memory cell and are close to each other with a trapping insulating film interposed therebetween are formed close to each other or formed in contact with each other, with the result that problems such as short-circuit or reduction in withstand voltage are caused in the memory cell.

The other problems and novel characteristics of the present invention will be apparent from the description of the present specification and the accompanying drawings.

The following is a brief description of an outline of the typical invention disclosed in the present application.

In a manufacturing method of a semiconductor device according to one embodiment, in the case in which a MONOS memory and a MISFET formed by a gate last process are mounted in a mixed manner, when polishing an interlayer insulating film to expose upper surfaces of a control gate electrode and a memory gate electrode from the interlayer insulating film, a first silicide layer to cover the upper surfaces of the gate electrodes is first formed, a metal film deposited on the silicide layer is then reacted with the control gate electrode and the memory gate electrode, thereby forming a second silicide layer thicker than the first silicide layer on each of the gate electrodes.

According to the embodiment, the reliability of the semiconductor device can be improved. In particular, it is possible to prevent the short-circuit between the control gate electrode and the memory gate electrode and the reduction in withstand voltage.

BRIEF DESCRIPTIONS OF THE DRAWINGS

FIG. 28 is a table showing one example of application conditions of voltage to respective portions of a selected memory cell in "writing", "erasing" and "reading" operations;

DESCRIPTIONS OF THE PREFERRED EMBODIMENTS

Figure 1:
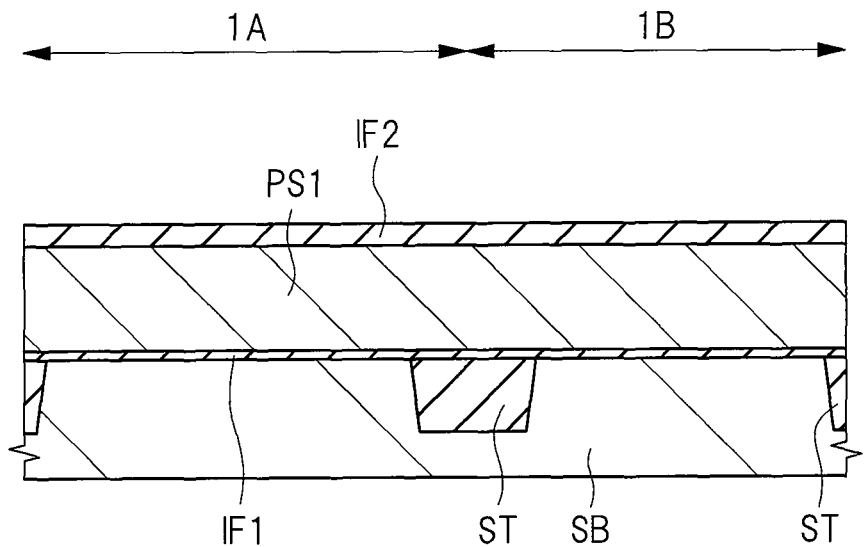
FIG. 1 is a cross-sectional view showing a manufacturing process of a semiconductor device according to the first embodiment.

Hereinafter, embodiments of the present invention will be described in detail with reference to the accompanying drawings. Note that components having the same function are denoted by the same reference characters throughout the drawings for describing the embodiments, and the repetitive description thereof will be omitted. In the following embodiments, the description of the same or similar parts is not repeated in principle except the case where it is particularly necessary.

Moreover, signs "−" and "+" represent relative concentrations of an impurity whose conductivity type is an n-type or a p-type. For example, in the case of an n-type impurity, the impurity concentration becomes higher in the order of "n−" to "n+".

The semiconductor device in the present embodiment and subsequent embodiments corresponds to a semiconductor device provided with a nonvolatile memory (nonvolatile memory element, flash memory, nonvolatile semiconductor storage device). In the present embodiment, the nonvolatile memory is described based on a memory cell made up of an n-channel MISFET (MISFET: Metal Insulator Semiconductor Field Effect Transistor).

Moreover, polarities (polarities of applied voltage and carrier polarities at the time of writing, erasing and reading operations) in the present embodiment and subsequent embodiments are defined for describing operations of a memory cell made up of an n-channel MISFET. Accordingly, in the case of describing operations of a memory cell made up of a p-channel MISFET, the same operations can be obtained in principle by inverting all the polarities of the applied potential, carrier conductivities and the like. Furthermore, in the description of the present application, a silicide layer formed by a reaction between a metal film and a semiconductor film and a semiconductor film are distinguished from each other. Namely, the silicide mentioned in the present application is a compound derived from metal and silicon and is not a semiconductor.

In the present application, the height indicates a distance from a main surface of a semiconductor substrate in a direction perpendicular to the main surface of the semiconductor substrate.

First Embodiment

<Manufacturing Method of Semiconductor Device>

A manufacturing method of a semiconductor device according to the present embodiment will be described with reference to FIG. 1 to FIG. 24.

FIG. 1 to FIG. 12 and FIG. 14 to FIG. 24 are cross-sectional views showing the manufacturing process of the semiconductor device according to the present embodiment. FIG. 13 is a cross-sectional view showing a sputtering apparatus used in the manufacturing process of the semiconductor device according to the present embodiment. In FIG. 1 to FIG. 12 and FIG. 14 to FIG. 24, a memory cell region 1A is shown on the left side of each drawing, and a peripheral circuit region 1B is shown on the right side thereof. A formation of a memory cell of a nonvolatile memory is shown in the memory cell region 1A and a formation of a MISFET is shown in the peripheral circuit region 1B, respectively.

Here, the case in which a memory cell made up of an n-channel MISFET (control transistor and memory transistor) is formed in the memory cell region 1A will be described, but a memory cell made up of a p-channel MISFET (control transistor and memory transistor) may be formed in the memory cell region 1A by inverting the conductivity type. Similarly, the case in which an n-channel MISFET is formed in the peripheral circuit region 1B will be described here, but a p-channel MISFET may be formed in the peripheral circuit region 1B by inverting the conductivity type.

Moreover, it is also possible to form both of an n-channel MISFET and a p-channel MISFET, that is, a CMISFET in the peripheral circuit region 1B. Furthermore, although a formation of a comparatively low withstand voltage MISFET in the peripheral circuit region 1B will be described in the present embodiment, a high withstand voltage MISFET different in a gate length or a thickness of a gate insulating film from the low withstanding voltage MISFET is also formed in the peripheral circuit region 1B.

In the manufacturing process of the semiconductor device, first, a semiconductor substrate (semiconductor wafer) SB made of p-type single crystal silicon (Si) or the like and having a resistivity of, for example, about 1 to 10 Ωcm is prepared as shown in FIG. 1. Then, a plurality of element isolation regions ST to specify active regions are formed in the main surface of the semiconductor substrate SB.

The element isolation region ST is made of an insulating material such as silicon oxide and can be formed by, for example, the STI method or the LOCOS method. In this case, the formation of the element isolation region ST by the STI method will be described.

Namely, after sequentially forming a silicon oxide film and a silicon nitride film on the semiconductor substrate SB, the silicon nitride film and the silicon oxide film are etched by using the photolithography technique and the dry etching method, thereby forming trenches in the upper surface of the semiconductor substrate SB. A plurality of the trenches are formed.

Subsequently, after an insulating film made of, for example, silicon oxide is buried in each of the trenches, the respective insulating films on the semiconductor substrate SB are removed by a polishing process or the like, thereby forming the plurality of element isolation regions ST. The element isolation regions ST are formed, for example, between the memory cell region 1A and the peripheral circuit region 1B and between MISFETs formed in the peripheral circuit region 1B.

Next, though an illustration thereof is omitted, a p-type well is formed in the main surface of the semiconductor substrate SB in the memory cell region 1A and the peripheral circuit region 1B. The p-type well can be formed by, for example, ion-implanting a p-type impurity such as boron (B) into the semiconductor substrate SB. Note that the p-type wells which are formed in the respective formation regions of the memory cell, the high withstand voltage MISFET and the low withstand voltage MISFET can be formed by the same ion-implanting process. Alternatively, these may be formed by respectively different ion-implanting processes in the respective regions in order to optimize characteristics of the respective elements.

Subsequently, an insulating film IF1 for use as a gate insulating film is formed on the main surface of the semiconductor substrate SB. Namely, the insulating film IF1 is formed on the upper surface of the semiconductor substrate SB in the memory cell region 1A and the peripheral circuit region 1B. As the insulating film IF1, for example, a silicon oxide film may be used. The respective insulating films IF1 in the memory cell region 1A and the peripheral circuit region 1B may be formed to have mutually different film thicknesses by forming them in different processes.

Thereafter, a silicon film PS1 made of a polycrystalline silicon film is formed on the semiconductor substrate SB by using, for example, the CVD (Chemical Vapor Deposition) method so as to cover the upper surface of the insulating film IF1. Alternatively, the silicon film PS1 can be formed by initially forming it as an amorphous silicon film and then converting it into the silicon film PS1 made of a polycrystalline silicon film by carrying out a heat treatment. Moreover, the silicon film PS1 may be formed as a low resistance semiconductor film (doped polysilicon film) by introducing an impurity thereto at the time of the film formation or by ion-implanting an impurity after the film formation. As the n-type impurity to be introduced into the silicon film PS1, for example, phosphorus (P) may be desirably used.

Thereafter, an insulating film IF2 is formed on the silicon film PS1 by using, for example, the CVD method. The insulating film IF2 is a cap insulating film made of, for example, silicon nitride (SiN). The film thickness of the insulating film IF2 can be set to, for example, about 20 to 50 nm.

Figure 2:
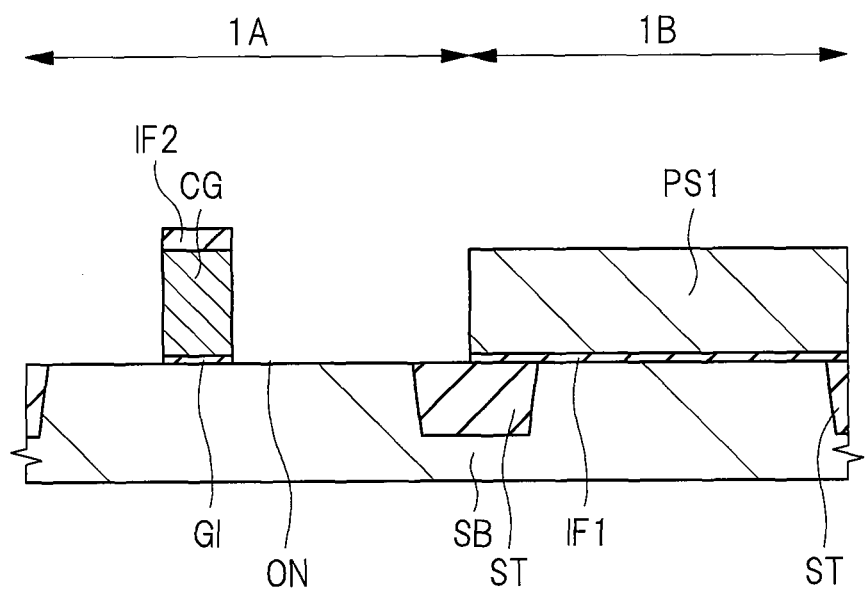
FIG. 2 is a cross-sectional view showing the manufacturing process of the semiconductor device continued from FIG. 1.

Next, as shown in FIG. 2, the stacked film composed of the insulating film IF2, the silicon film PS1 and the insulating film IF1 in the memory cell region 1A is patterned by the photolithography technique and the etching technique. Thus, a gate insulating film GI made of the insulating film IF1 is formed in the memory cell region 1A. Moreover, by this etching process, a control gate electrode CG made of the silicon film PS1 in the memory cell region 1A is formed. The control gate electrode CG corresponds to a pattern that is silicided to be a control gate electrode in the subsequent process. The control gate electrode CG is the pattern that extends in a predetermined direction when seen in a plan view. The predetermined direction, that is, a gate width direction is a depth direction in FIG. 2.

For example, the above-mentioned patterning process is carried out in the following manner. That is, the insulating film IF2, the silicon film PS1 and the insulating film IF1 in the memory cell region 1A are processed by using the photolithography technique and the dry etching method. Thus, the control gate electrode CG and the gate insulating film GI are formed. Note that it is also possible to first process the insulating film IF2 in the memory cell region 1A by using the photolithography technique and the dry etching method and then process the silicon film PS1 and the insulating film IF1 with using the insulating film IF2 as a mask.

Figure 3:
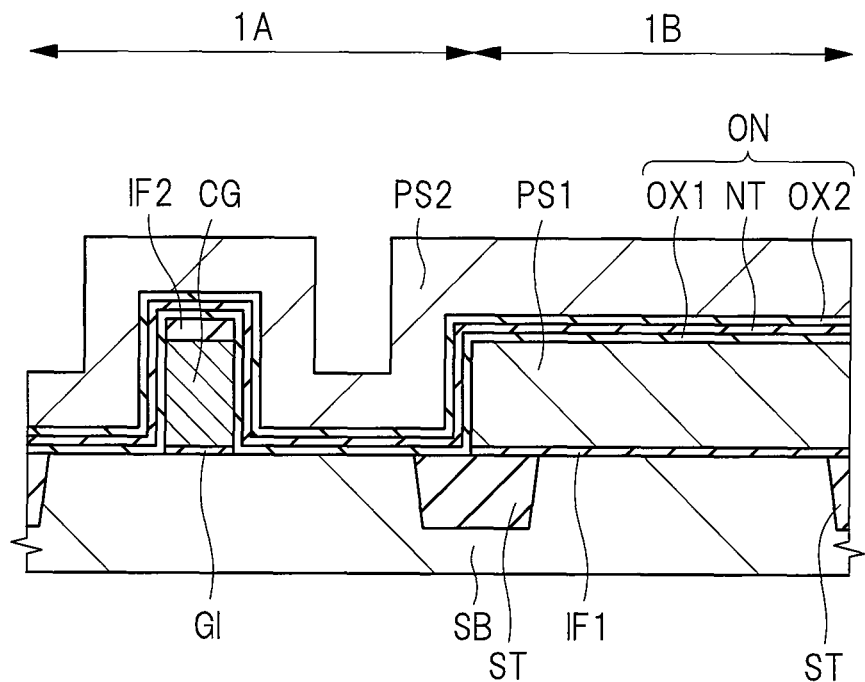
FIG. 3 is a cross-sectional view showing the manufacturing process of the semiconductor device continued from FIG. 2.

Next, as shown in FIG. 3, the insulating film IF2 in the peripheral circuit region 1B is removed by using the photolithography technique and the wet etching method. Thus, the upper surface of the silicon film PS1 in the peripheral circuit region 1B is exposed. At this time, the insulating film IF2 in the memory cell region 1A is not removed.

Thereafter, an ONO (oxide-nitride-oxide) film ON for a gate insulating film of a memory transistor is formed on the entire main surface of the semiconductor substrate SB. The ONO film ON covers the upper surface of the semiconductor substrate SB in the memory cell region 1A and side walls and the upper surface of the stacked film composed of the gate insulating films GI and IF2 and the control gate electrode CG, and further covers side walls and the upper surface of the stacked film composed of the insulating film IF1 and the silicon film PS1 in the peripheral circuit region 1B.

The ONO film ON is an insulating film having a charge accumulation part therein. Specifically, the ONO film ON is a stacked film composed of a silicon oxide film OX1 formed on the semiconductor substrate SB, a silicon nitride film NT formed on the silicon oxide film OX1 and a silicon oxide film OX2 formed on the silicon nitride film NT.

The silicon oxide films OX1 and OX2 can be formed by using, for example, an oxidizing process (thermal oxidizing process), the CVD method or a combination thereof. The ISSG (In-Situ Steam Generation) oxidation can also be used for the oxidizing process at this time. The silicon nitride film NT can be formed by, for example, the CVD method.

In the present embodiment, the silicon nitride film NT is formed as an insulating film (charge accumulation layer) that constitutes a memory cell and has a trap level. As the film used for the charge accumulation layer, a silicon nitride film is desirable from the viewpoint of reliability or the like, but it is not limited to the silicon nitride film. For example, a high dielectric constant film (high dielectric constant insulating film) such as an aluminum oxide film (alumina), a hafnium oxide film or a tantalum oxide film having a dielectric constant higher than that of the silicon nitride film may be used as the charge accumulation layer or the charge accumulation part.

The thickness of the silicon oxide film OX1 can be set to, for example, about 2 to 10 nm, the thickness of the silicon nitride film NT can be set to, for example, about 5 to 15 nm, and the thickness of the silicon oxide film OX2 can be set to, for example, 2 to 10 nm.

Subsequently, a polycrystalline silicon film PS2 is formed by using, for example, the CVD method on the entire main surface of the semiconductor substrate SB so as to cover the surface of the ONO film ON. Thus, the side walls and upper surface of the ONO film ON exposed in the memory cell region 1A are covered with the silicon film PS2. Namely, on the side walls of the control gate electrode CG, the silicon film PS2 is formed with the ONO film ON interposed therebetween.

The film thickness of the silicon film PS2 is, for example, 40 nm. Alternatively, the silicon film PS2 may be formed by initially forming it as an amorphous silicon film and then converting it into the silicon film PS2 made of a polycrystalline silicon film by carrying out a heat treatment. For example, the silicon film PS2 is a film to which a p-type impurity (for example, boron (B)) is introduced at a comparatively high concentration. The silicon film PS2 is a film for forming a memory gate electrode MG to be described later.

In the case of a specific film, the film thickness mentioned here refers to the thickness of the film in a direction perpendicular to the surface of the base material of the film. For example, in the case in which the silicon film PS2 is formed on a surface along the main surface of the semiconductor substrate SB like the upper surface of the ONO film ON, the film thickness of the silicon film PS2 refers to the thickness of the silicon film PS2 in a direction perpendicular to the main surface of the semiconductor substrate SB. Moreover, in the case of the silicon film PS2 corresponding to a portion formed in contact with a wall perpendicular to the main surface of the semiconductor substrate SB like the side walls of the ONO film ON, the thickness of the silicon film PS2 refers to the thickness in a direction perpendicular to the corresponding side wall.

Although FIG. 3 shows the ONO film ON having a stacked structure of three layers of the silicon oxide film OX1, the silicon nitride film NT and the silicon oxide film OX2, the illustration of the stacked structure of the ONO film ON is omitted in the cross-sectional views to be used in the following description for convenience of understanding. Namely, the ONO film ON has a stacked structure, but the illustration of borders between respective films constituting the ONO film ON is omitted and the ONO film ON is shown as a single film in the drawings used for the following description.

Figure 4:
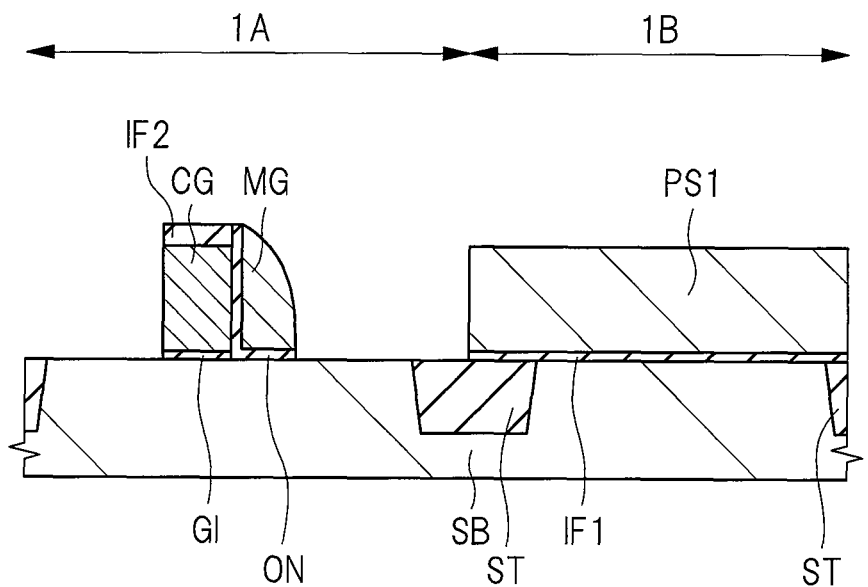
FIG. 4 is a cross-sectional view showing the manufacturing process of the semiconductor device continued from FIG. 3.

Next, as shown in FIG. 4, by etching back (etching, dry etching, or anisotropic etching) the silicon film PS2 by the anisotropic etching technique, the upper surface of the ONO film ON is exposed. In this etching back process, by carrying out the anisotropic etching (etching back) to the silicon film PS2, the silicon film PS2 is left in a sidewall shape on both of the side walls of the stacked film composed of the gate insulating films GI and IF2 and the control gate electrode CG with the ONO film ON interposed therebetween.

Thus, in the memory cell region 1A, a memory gate electrode MG which is made of the silicon film PS2 left in a sidewall shape is formed on one of the side walls of the stacked film with the ONO film ON interposed therebetween. Moreover, by the etching back process described above, the upper surface of the ONO film ON in the peripheral circuit region 1B is exposed.

Subsequently, a resist film (not shown) which covers the memory gate electrode MG adjacent to one of the side walls of the control gate electrode CG and does not cover the silicon film PS2 adjacent to the other side wall of the control gate electrode CG is formed on the semiconductor substrate SB by using the photolithography technique. Thereafter, by carrying out an etching process with using the resist film as an etching mask, the silicon film PS2 formed on the side opposite to the memory gate electrode MG with the control gate electrode CG sandwiched therebetween is removed. Then, the resist film is removed. In this etching process, the memory gate electrode MG is left without being etched because it is covered with the resist film.

Next, a part of the ONO film ON which is exposed without being covered with the memory gate electrode MG is removed by etching (for example, wet etching). At this time, in the memory cell region 1A, the ONO film ON directly under the memory gate electrode MG is left without being removed. Similarly, the ONO film ON located between the stacked film including the gate insulating films GI and IF2 and the control gate electrode CG and the memory gate electrodes MG is left without being removed. Since the ONO film ON in the other region is removed, the upper surface of the semiconductor substrate SB in the memory cell region 1A is exposed, the upper surface of the stacked film is exposed, and the upper surface of the silicon film PS1 in the peripheral circuit region 1B is exposed. Moreover, the side wall of the control gate electrode CG that is not adjacent to the memory gate electrode MG is exposed.

In this manner, the memory gate electrode MG is formed on the semiconductor substrate SB so as to be adjacent to the control gate electrode CG with the ONO film ON having the charge accumulation part therein interposed therebetween.

Figure 5:
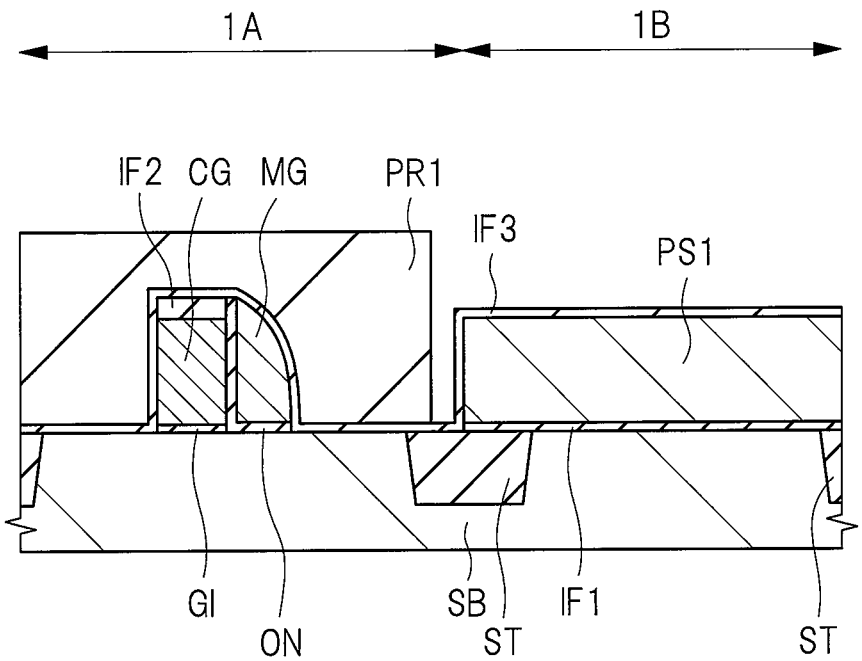
FIG. 5 is a cross-sectional view showing the manufacturing process of the semiconductor device continued from FIG. 4.

Next, as shown in FIG. 5, an insulating film IF3 is formed on the entire main surface of the semiconductor substrate SB by using, for example, the CVD method. The insulating film IF3 is made of, for example, a silicon nitride film. Thus, the silicon film PS1 in the peripheral circuit region 1B is covered with the insulating film IF3. Moreover, the stacked film composed of the gate insulating film GI, the control gate electrode CG and the insulting film IF2 in the memory cell region 1A, the ONO film ON and the memory gate electrode MG adjacent to the side wall of the stacked film, and the main surface of the semiconductor substrate SB in the memory cell region 1A are covered with the insulating film IF3. Although not shown in the drawings, a silicon oxide film may be deposited on the entire main surface of the semiconductor substrate SB by using, for example, the CVD method prior to the formation of the insulating film IF3.

Subsequently, a resist film PR1 which covers the insulating film IF3 in the memory cell region 1A is formed by using the photolithography technique. Note that the insulating film IF3 that is in contact with the upper surface and side walls of the silicon film PS1 is exposed from the resist film PR1.

Figure 6:
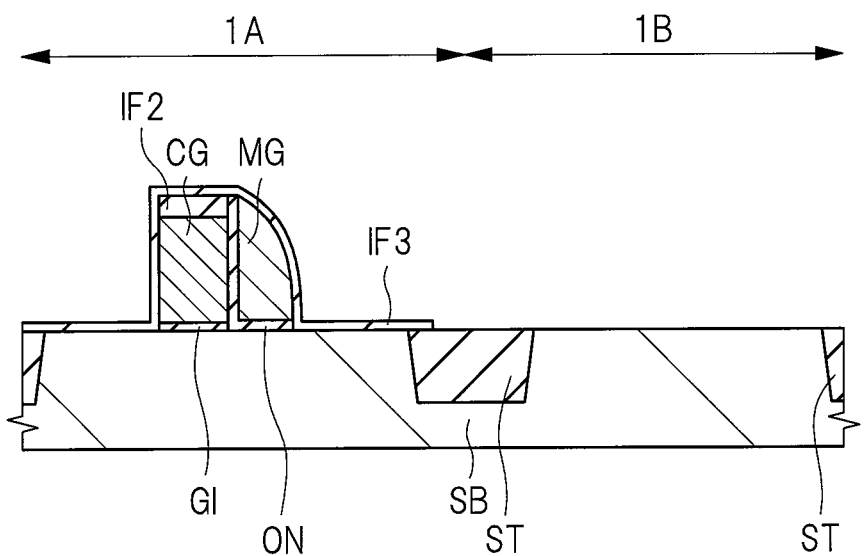
FIG. 6 is a cross-sectional view showing the manufacturing process of the semiconductor device continued from FIG. 5.

Next, as shown in FIG. 6, the insulating film IF3 exposed from the resist film PR1 is removed by the wet etching method, and then the resist film PR1 is removed. Thus, the insulating film IF3 in the peripheral circuit region 1B is removed, so that the silicon film PS1 and the insulating film IF1 are exposed.

Thereafter, the silicon film PS1 and the insulating film IF1 in the peripheral circuit region 1B are removed by using, for example, the wet etching method. At this time, the stacked film composed of the gate insulating film GI, the control gate electrode CG and the insulating film IF2 and the ONO film ON and the memory gate electrode MG adjacent to the side wall of the stacked film in the memory cell region 1A are not removed because they are covered with the insulating film IF3.

Figure 7:
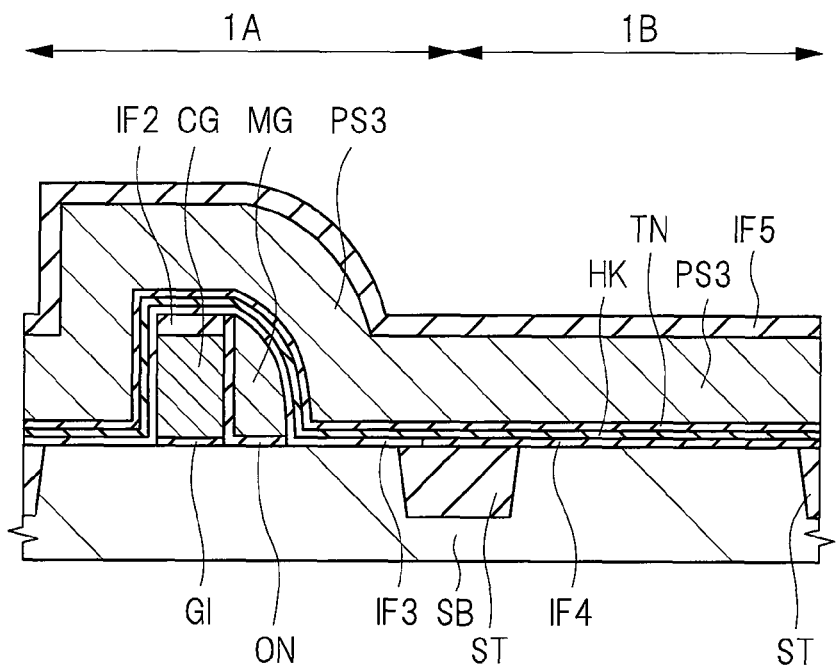
FIG. 7 is a cross-sectional view showing the manufacturing process of the semiconductor device continued from FIG. 6.

Next, as shown in FIG. 7, insulating films IF4 and HK, a metal film TN, a silicon film PS3 and an insulating film IF5 are sequentially formed on the entire main surface of the semiconductor substrate SB. Thus, the stacked film composed of the gate insulating film GI, the control gate electrode CG and the insulating film IF2 and the ONO film ON and the memory gate electrode MG adjacent to the side wall of the stacked film in the memory cell region 1A are covered with the insulating films IF3, IF4 and HK, the metal film TN, the silicon film PS3 and the insulating film IF5.

The insulating film IF4 is made of, for example, a silicon oxide film and can be formed by using an oxidation method such as a thermal oxidation method. The insulating film HK is an insulating film for use as the gate insulating film. Specifically, the insulating film HK is a film that constitutes the gate insulating film of a MISFET to be formed in the peripheral circuit region 1B later. The insulating film HK is an insulating material film having a dielectric constant (specific dielectric constant) higher than any of the silicon oxide and the silicon nitride, that is, a so-called high-k film (high dielectric constant film).

As the insulating film HK, a metal oxide film such as a hafnium oxide film, a zirconium oxide film, an aluminum oxide film, a tantalum oxide film or a lanthanum oxide film may be used, and these metal oxide films may further contain one or both of nitrogen (N) and silicon (Si). The insulating film HK can be formed by using, for example, the ALD (Atomic Layer Deposition) method. The film thickness of the insulating film HK is, for example, 1.5 nm. In the case in which the high dielectric constant film (in this case, insulating film HK) is used as the gate insulating film, the physical film thickness of the gate insulating film can be increased in comparison with the case of using a silicon oxide film, so that the advantage of the reduction of the leakage current can be achieved.

The metal film TN is made of, for example, a titanium nitride film and can be formed by using, for example, the sputtering method. The silicon film PS3 is made of a polysilicon film and can be formed by using, for example, the CVD method. The film thickness of the silicon film PS3 is, for example, 40 nm. Alternatively, the silicon film PS3 can be formed by initially forming it as an amorphous silicon film and then converting it into the silicon film PS3 made of a polycrystalline silicon film by carrying out a heat treatment. The silicon film PS3 is a film to which a p-type impurity (for example, boron (B)) is introduced at a comparatively high concentration. The silicon film PS3 is a film used for forming a dummy gate electrode DG described later. The insulating film IF5 is a cap insulating film made of, for example, silicon nitride and can be formed by using, for example, the CVD method.

Figure 8:
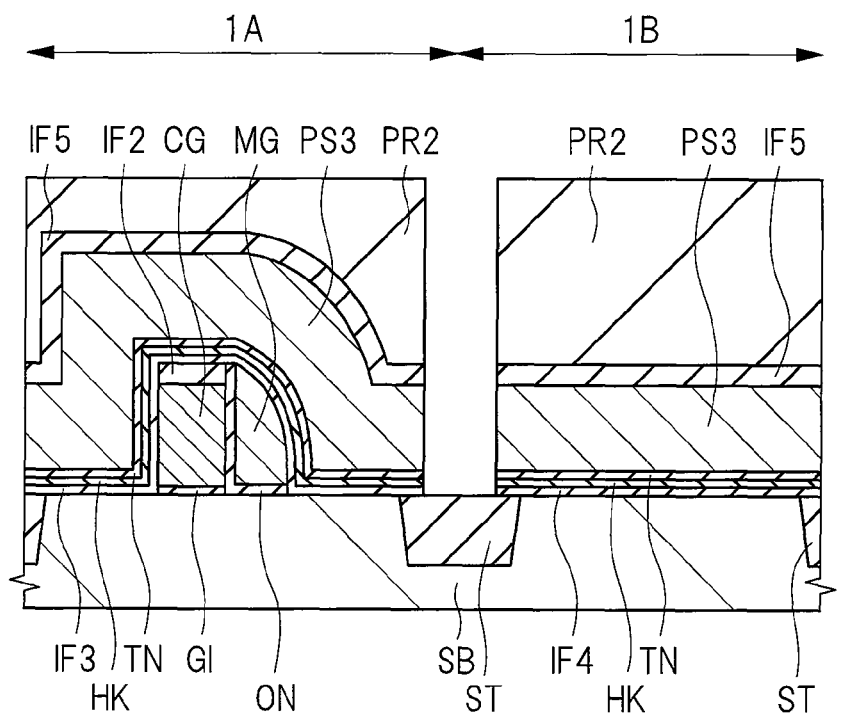
FIG. 8 is a cross-sectional view showing the manufacturing process of the semiconductor device continued from FIG. 7.

Next, as shown in FIG. 8, a resist film PR2 patterned by the photolithography technique is formed. The resist film PR2 is a resist film from which the semiconductor substrate SB and the element isolation region ST in the vicinity of a border between the memory cell region 1A and the peripheral circuit region 1B are exposed. Thereafter, by carrying out an etching process using the resist film PR2 as a mask, the insulating film IF5, the silicon film PS3, the metal film TN, the insulating film HK and the insulating film IF4 are removed. Thus, the silicon film PS3 in the memory cell region 1A and the silicon film PS3 in the peripheral circuit region 1B are separated from each other.

Figure 9:
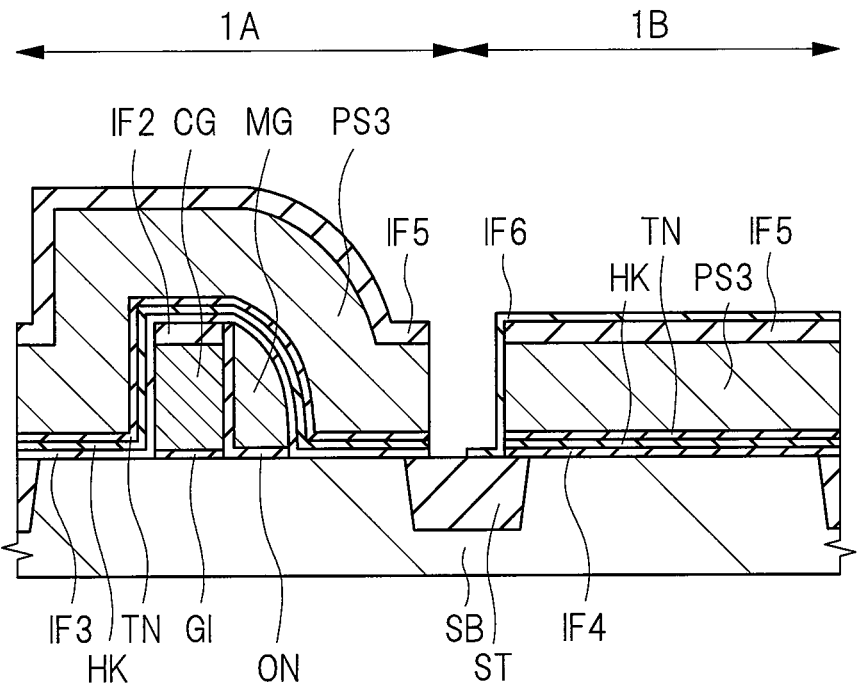
FIG. 9 is a cross-sectional view showing the manufacturing process of the semiconductor device continued from FIG. 8.

Next, as shown in FIG. 9, after the resist film PR2 is removed, an insulating film IF6 is formed on the entire main surface of the semiconductor substrate SB by using, for example, the CVD method. The insulating film IF6 is a cap insulating film made of, for example, a silicon oxide film. Thereafter, the insulating film IF6 in the memory cell region 1A is removed by using the photolithography technique and the etching method. Thus, the memory cell region 1A is exposed from the insulating film IF6, and the insulating films IF4 and HK, the metal film TN, the silicon film PS3 and the insulating film IF5 in the peripheral circuit region 1B are covered with the insulating film IF6.

Figure 10:
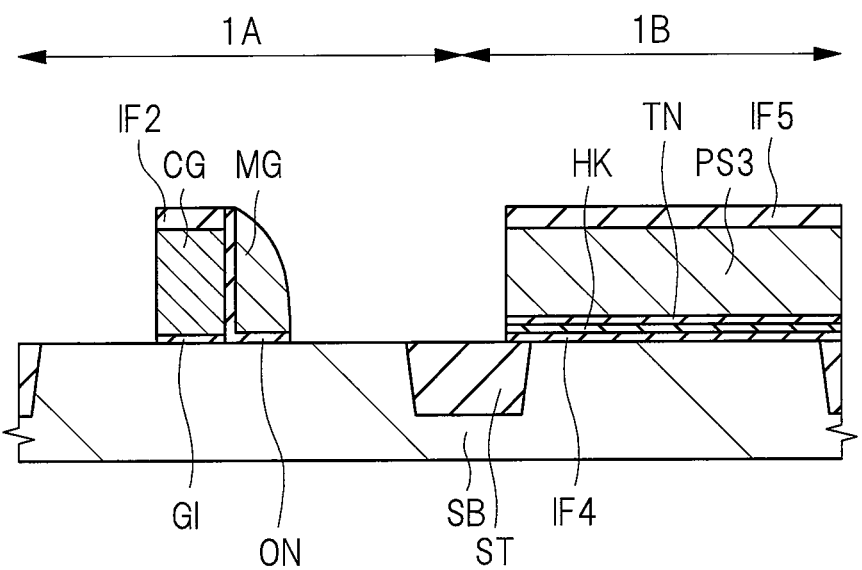
FIG. 10 is a cross-sectional view showing the manufacturing process of the semiconductor device continued from FIG. 9.

Next, as shown in FIG. 10, the insulating film IF5 and the silicon film PS3 in the memory cell region 1A are removed by using phosphoric acid, and then the metal film TN and the insulating films HK and IF3 are removed. At this time, the structure formed on the semiconductor substrate SB in the peripheral circuit region 1B is not removed because it is covered with the resist film. Thus, the stacked film composed of the gate insulating film GI, the control gate electrode CG and the insulating film IF2, the ONO film ON and memory gate electrode MG adjacent to the side wall of the stacked film, and the main surface of the semiconductor substrate SB in the memory cell region 1A are exposed. Thereafter, the insulating film IF6 in the peripheral circuit region 1B is removed.

Figure 11:
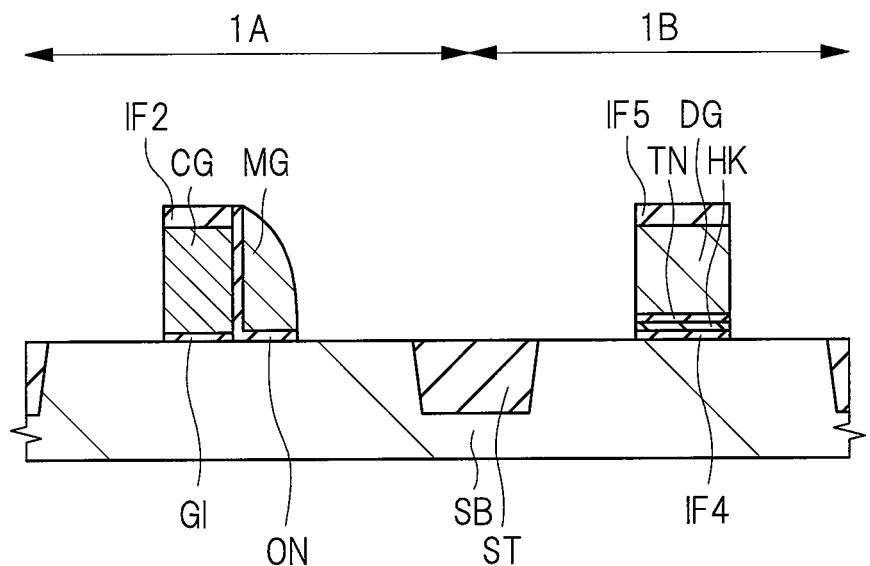
FIG. 11 is a cross-sectional view showing the manufacturing process of the semiconductor device continued from FIG. 10.

Next, as shown in FIG. 11, the insulating film IF5, the silicon film PS3, the metal film TN and the insulating films HK and IF4 in the peripheral circuit region 1B are patterned by using the photolithography technique and the etching technique. Thus, a dummy gate electrode DG made of the silicon film PS3 and a gate insulating film made of the insulating films HK and IF4 are formed in a region in which a MISFET constituting a peripheral circuit is to be formed. In this case, after patterning the insulating film IF5 by using the photolithography technique and the etching method, an etching process using the insulating film IF5 as a mask is carried out with the memory cell region 1A being covered with the resist film, thereby patterning the silicon film PS3, the metal film TN and the insulating films HK and IF4.

Figure 12:
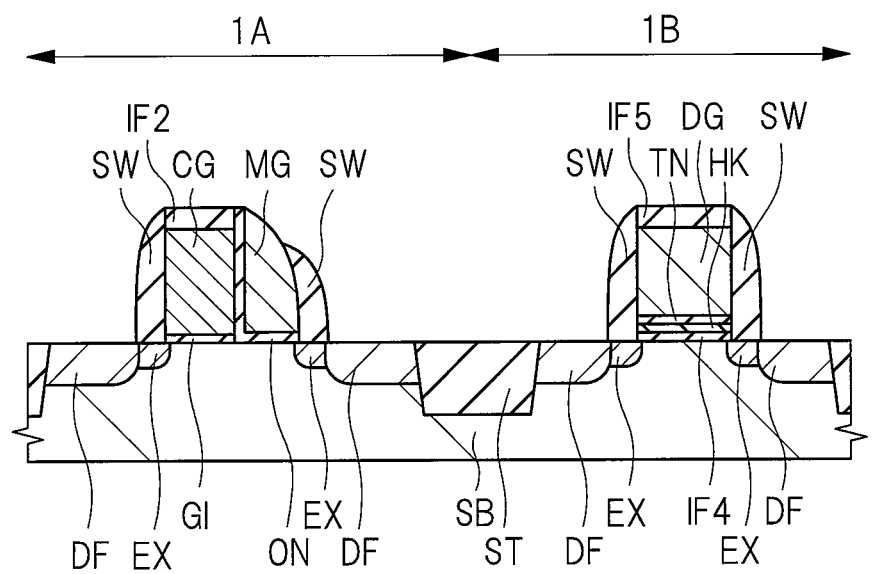
FIG. 12 is a cross-sectional view showing the manufacturing process of the semiconductor device continued from FIG. 11.
Figure 13:
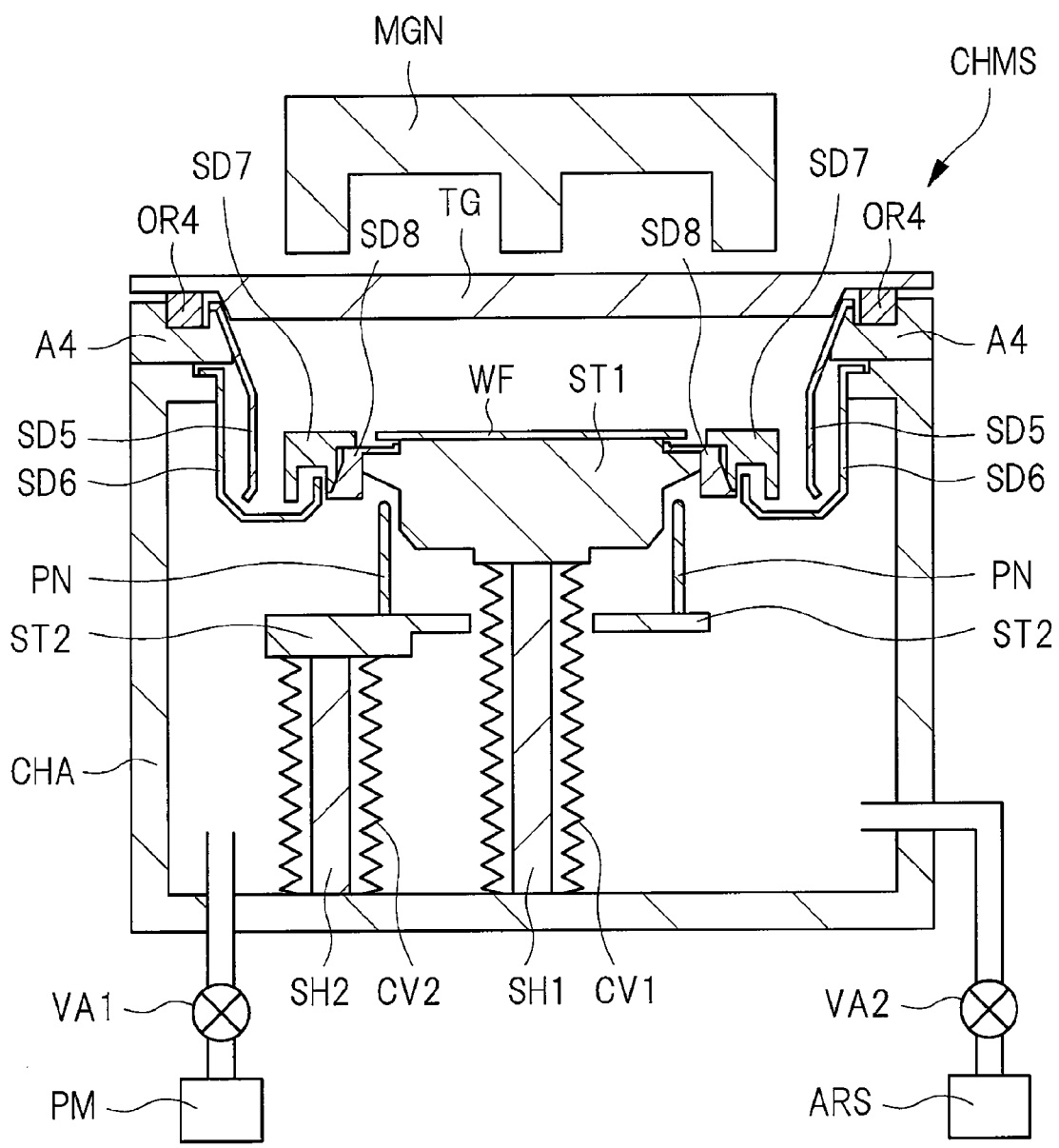
FIG. 13 is a cross-sectional view showing a sputtering apparatus used in the manufacturing process of the semiconductor device according to the first embodiment.

Next, as shown in FIG. 12, a plurality of extension regions ($n^-$-type semiconductor regions, that is, impurity diffusion regions) EX are formed by using, for example, an ion implanting method. Namely, the plurality of extension regions EX are formed by introducing an n-type impurity such as arsenic (As) or phosphorus (P) into the semiconductor substrate SB by the ion implanting method with using the gate insulating film GI, the control gate electrode CG, the memory gate electrode MG, the dummy gate electrode DG and the ONO film ON as a mask. Offset spacers that respectively cover the side walls of the structure including the gate insulating film GI, the control gate electrode CG, the insulating film IF2, the ONO film ON and the memory gate electrode MG and the side walls of the dummy gate electrode DG may be formed from, for example, a silicon nitride film, a silicon oxide film or a stacked film of these films prior to the formation of the extension regions EX.

The respective extension regions EX of the memory cell region 1A and the peripheral circuit region 1B can be formed by the same ion implanting process or can be formed by different ion implanting processes. Although not shown in the drawings, a halo region may be formed by implanting a p-type impurity (for example, boron (B)) into the main surface of the semiconductor substrate SB in the peripheral circuit region 1B with using the insulating film IF5 and the dummy gate electrode DG as a mask before or after the formation process of the extension regions EX. The halo region is formed in a part closer to the main surface of the semiconductor substrate SB located directly below the center of the dummy gate electrode DG than the extension region EX, that is, in a part close to the channel region of the MISFET to be formed in the peripheral circuit region 1B in the subsequent process. By forming the halo region, it is possible to improve short channel characteristics of the MISFET.

Subsequently, sidewalls SW which cover the side walls on both sides of the structure including the control gate electrode CG and the memory gate electrode MG in the memory cell region 1A are formed. Moreover, by this process, sidewalls SW which cover the side walls on both sides of the stacked film composed of the gate insulating film GI, the insulating film HK, the metal film TN, the dummy gate electrode DG and the insulating film IF5 are formed in the peripheral circuit region 1B.

The sidewalls SW can be formed in a self-aligned manner by sequentially forming a silicon oxide film and a silicon nitride film on the semiconductor substrate SB by using the CVD method or the like and then partially removing the silicon oxide film and the silicon nitride film by the anisotropic etching process so as to expose the upper surface of the semiconductor substrate SB and the upper surfaces of the insulating films IF2 and IF5. Namely, although the sidewall SW is supposed to be formed of a stacked film, interfaces between the films constituting the stacked film are not illustrated in the drawings.

Next, diffusion regions ($n^+$-type semiconductor region or impurity diffusion region) DF are formed in the memory cell region 1A and the peripheral circuit region 1B by using the ion implanting method or the like. Namely, by introducing an n-type impurity (for example, arsenic (As) or phosphorus (P)) into the semiconductor substrate SB by the ion implanting method with using the gate insulating film GI, the control gate electrode CG, the insulating film IF2, the ONO film ON, the memory gate electrode MG, the dummy gate electrode DG and the sidewall SW as a mask (ion implantation prevention mask), the diffusion regions DF can be formed. The diffusion region DF has an impurity concentration higher than that of the extension region EX and a junction depth larger than that of the extension region EX.

Thus, it is possible to form source/drain regions each composed of the extension region EX and the diffusion region DF having an impurity concentration higher than that of the extension region EX and having an LDD (Lightly Doped Drain) structure.

In the memory cell region 1A, the extension regions EX and the diffusion regions DF which are formed in the upper surface of the semiconductor substrate SB beside the structure including the control gate electrode CG and the memory gate electrode MG constitute the source/drain regions of each of a control transistor and a memory transistor of the memory cell region 1A to be formed later. Moreover, in the peripheral circuit region 1B, the extension regions EX and the diffusion regions DF which are formed in the upper surface of the semiconductor substrate SB beside the dummy gate electrode DG constitute the source/drain regions of a MISFET in the peripheral circuit region 1B to be formed later. The respective diffusion regions in the memory cell region 1A and the peripheral circuit region 1B can be formed by the same ion implanting process or can be formed by different ion implanting processes.

Subsequently, an activation annealing process which is a heat treatment for activating the impurities implanted into the semiconductor regions for the source and the drain (extension regions EX and diffusion regions DF) is carried out.

Next, a silicide layer is formed by executing a so-called salicide (Self Aligned Silicide) process described with reference to FIG. 13 to FIG. 15. Specifically, the silicide layer is formed in the following manner.

That is, by carrying out a chemical dry etching process to the main surface of the semiconductor substrate SB as a pretreatment process, an excessive silicon oxide film and the like on the semiconductor substrate SB are removed and the surface of the semiconductor is exposed. Subsequently, a metal film MF1 (see FIG. 14) for forming a silicide layer is formed (deposited) on the entire main surface of the semiconductor substrate SB including the upper surface of the diffusion region DF and the upper surface of the memory gate electrode MG. The film thickness of the metal film MF1 is, for example, 20 to 25 nm.

The metal film MF1 is made of, for example, an alloy film of nickel (Ni) and platinum (Pt) and can be formed by the sputtering method. When forming the metal film MF1 by using the sputtering method (normal sputtering method), a sputtering apparatus shown in FIG. 13 is used.

As shown in FIG. 13, the sputtering apparatus to be used in a film-forming process by the normal sputtering method has a chamber CHMS. A pump PM for exhausting gas inside the chamber CHMS to make the inside of the chamber CHMS into a vacuum state is connected to the chamber CHMS. Namely, the chamber CHMS is a vacuum chamber capable of making the inside into a vacuum state. Moreover, an argon gas supply source ARS for supplying argon gas (Ar) into the chamber CHMS is connected to the chamber CHMS. A valve VA1 and a valve VA2 for opening/closing pipes are installed between the chamber CHMS and the pump PM and between the chamber CHMS and the argon gas supply source ARS, respectively.

The chamber CHMS includes a container CHA having a bottom and side walls, and an annular adaptor A4 is attached onto the container CHA. A target TG made of, for example, nickel platinum (NiPt) is disposed on the adaptor A4 so as to cover an opening of the upper portion of the annular adaptor A4. Since the inside of the chamber CHMS is tightly closed by the container CHA, the adaptor A4 and the target TG, the inside of the chamber CHMS can be set to a vacuum state by exhausting the gas inside the chamber CHMS by the pump PM in the state in which the valve VA1 is kept opened.

95% of the metal forming the target TG is nickel (Ni) and the other 5% is platinum (Pt).

Note that an annular O-ring OR4 is disposed between the adaptor A4 and the target TG, and it prevents the gas outside the chamber CHMS from being sucked into the chamber CHMS. The adaptor A4 is made of, for example, Al (aluminum), and the O-ring OR4 is made of, for example, Cu (Copper).

In the center of the inside of the chamber CHMS, a wafer stage ST1 is disposed, and a sheet of a semiconductor wafer WF is placed on the wafer stage ST1. The semiconductor wafer WF is a film-forming target corresponding to the semiconductor substrate SB shown in FIG. 12. The wafer stage ST1 is supported by a shaft SH1 located thereunder. A hole is formed in the wafer stage ST1 so as to penetrate it from the upper surface to the lower surface, and a pin PN capable of being moved in an upper/lower direction is disposed right below the hole.

The pin PN is fixed to an upper surface of a stage ST2, and the stage ST2 is supported by a shaft SH2 located thereunder. The pin PN has a function to raise the semiconductor wafer WF by moving upward together with the stage ST2 to protrude above the upper surface of the wafer stage ST1 when transporting the semiconductor wafer WF. The shaft SH1 is covered with a bellows-shaped cover CV1 around it, and the shaft SH2 is covered with a cover CV2 in the same manner. In the drawing, the hole opened in the wafer stage ST1 through which the pin PN passes so as to raise the semiconductor wafer WF is not shown.

The above-mentioned structure of the chamber CHMS is substantially the same as the structure of the chamber for the sputtering process using the long throw sputtering method to be described later with reference to FIG. 30, but the distance between the semiconductor wafer WF and the target TG is shorter in the chamber CHMS shown in FIG. 13. The distance between the semiconductor wafer WF and the target TG shown in FIG. 13 is, for example, several centimeters and less than 10 cm.

In the sputtering process, argon gas (Ar) supplied from the argon gas supply source ARS is ionized and bombarded onto the target TG. Thus, atoms forming the target TG are sputtered, and the sputtered target material is deposited onto the upper surface of the semiconductor wafer WF disposed so as to be opposed to the target TG. Note that the argon gas is used as the gas to be supplied into the sputtering apparatus in this case, but Xe (xenon) or the like may also be used in addition to argon (Ar).

Specifically, argon gas (Ar) is first introduced from the argon gas supply source ARS into the chamber CHMS kept in a high vacuum state by using the pump PM. Next, the argon gas is ionized into argon ions ($Ar^+$) by utilizing a glow discharge by a high electric field applied between the target TG and the semiconductor wafer WF.

In this case, a magnetic field is generated by a magnet MGN disposed on the target TG, and a DC power is further applied to the target TG. Thus, secondary electrons emitted by bombarding ionized atoms of Ar (argon) to the bottom surface of the target TG are captured by Lorentz force, so that the ionization of the inactive gas is accelerated by cyclotron movements. In this manner, a magnetron sputtering method is adopted in which negative ions and secondary electrons are captured by the magnetic field of the magnet MGN, so that the temperature rise of the target TG and the semiconductor wafer WF is suppressed and the ionization of the gas is accelerated by the captured electrons to increase the film-forming rate.

When applying the DC voltage to the target TG so as to generate the high electric field, the DC voltage is applied with the electric power of, for example, 10 to 20 kW.

Atoms of the target material recoiled and jumped out when argon ions are accelerated by the above-mentioned high electric field and bombarded onto the target TG are partially adhered to the main surface of the semiconductor wafer WF. Thus, a film made of the adhesion on the main surface of the semiconductor wafer WF, that is, a sputter film is formed. The sputter film mentioned here is a film formed by the sputtering method. Specifically, the sputter film is formed by depositing a component emitted and sputtered from the target TG.

Figure 14:
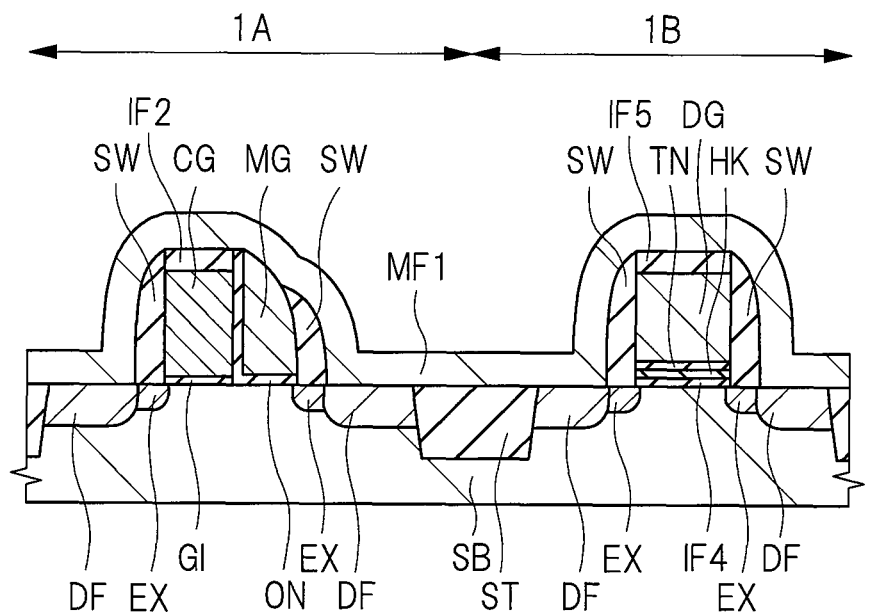
FIG. 14 is a cross-sectional view showing the manufacturing process of the semiconductor device continued from FIG. 12.

By the above-mentioned sputtering process, the component sputtered from the target TG is adhered to the upper surface of the semiconductor wafer WF, so that the metal film MF1 shown in FIG. 14 is formed.

Note that, in the lateral direction of the wafer stage ST1, annular shields SD5, SD6, SD7 and SD8 which surround the periphery of the wafer stage ST1 having a round shape when seen in a plan view are disposed. The shield SD8 is disposed adjacent to the side wall of the wafer stage ST1, and the shield SD7 is disposed outside the shield SD8. The shields SD5 and SD6 extend toward an upper side in comparison with the shields S7 and S8, that is, extend in a target TG direction, and the shield SD5 extends to a region nearest to the bottom surface of the target TG among the respective shields.

In this manner, the periphery of the region between the target TG and the wafer stage ST1 is surrounded by the shields SD5 to SD8. For this reason, when the sputtering process is carried out by using the chamber CHMS to form a sputter film on the semiconductor wafer WF by sputtering the target material out from the target TG, even if the target material is scattered to portions other than the surface of the semiconductor wafer WF, it is possible to prevent the target material from being adhered to the surface of the container CHA or the like. Note that the shield SD5 is supported by the adaptor A4.

The metal film MF1 shown in FIG. 14 is an alloy film containing nickel and a material to be added to nickel in the alloy film is not limited to platinum, and aluminum (Al), carbon (C) or the like may be used. However, platinum has a high heat resistant property in comparison with aluminum, carbon or the like and is thus preferably applied for the alloy film.

Figure 15:
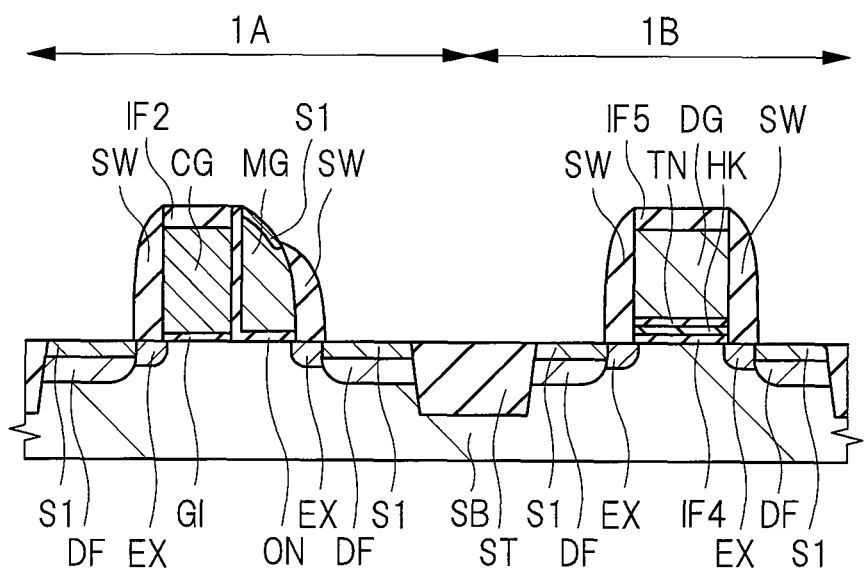
FIG. 15 is a cross-sectional view showing the manufacturing process of the semiconductor device continued from FIG. 14.

Next, as shown in FIG. 15, by carrying out a heat treatment to the semiconductor substrate SB, the surface layer portions of the diffusion region DF and the memory gate electrode MG are reacted with the metal film MF1. By this reaction, that is, silicidation, a silicide layer S1 is formed on each upper portion of the diffusion region DF and the memory gate electrode MG. Then, the metal film MF1 that is unreacted even by the above-mentioned heat treatment is removed by the wet etching or the like.

In this heat treatment, a heat treatment apparatus which applies heat to the semiconductor substrate by a carbon heater is used. In this case, the heat treatment includes two heat treatment processes. Namely, in the first heat treatment process, a silicide layer S1 containing fine crystals of NiSi and $Ni_2Si$ is formed by the heating, for example, at 260° C. for 30 to 120 seconds. Then, after the unreacted metal film MF1 is removed by the wet etching or the like as described above, NiSi crystals in the silicide layer S1 are grown by the heating at 600° C. for 5 to 30 seconds in the second heat treatment process. By carrying out the heat treatment twice in a separated manner, it is possible to prevent the silicide layer S1 from abnormally growing to extend inside the semiconductor substrate SB. The silicide layer S1 formed in this manner is made of, for example, nickel platinum (NiPt) silicide.

Note that, since the upper surface of the control gate electrode CG is covered with the insulating film IF2 serving as the cap film, no silicide layer S1 is formed on the upper portion of the control gate electrode CG. Similarly, since the upper surface of the dummy gate electrode DG in the peripheral circuit region 1B is also covered with the insulating film IF5 serving as the cap film, no silicide layer S1 is formed on the upper portion of the dummy gate electrode DG. Moreover, since the upper surface of the memory gate electrode MG in a sidewall shape is exposed, the silicide layer S1 is formed on the exposed portion. However, this silicide layer S1 is removed in the subsequent polishing process by the CMP (Chemical Mechanical Polishing) method.

Figure 16:
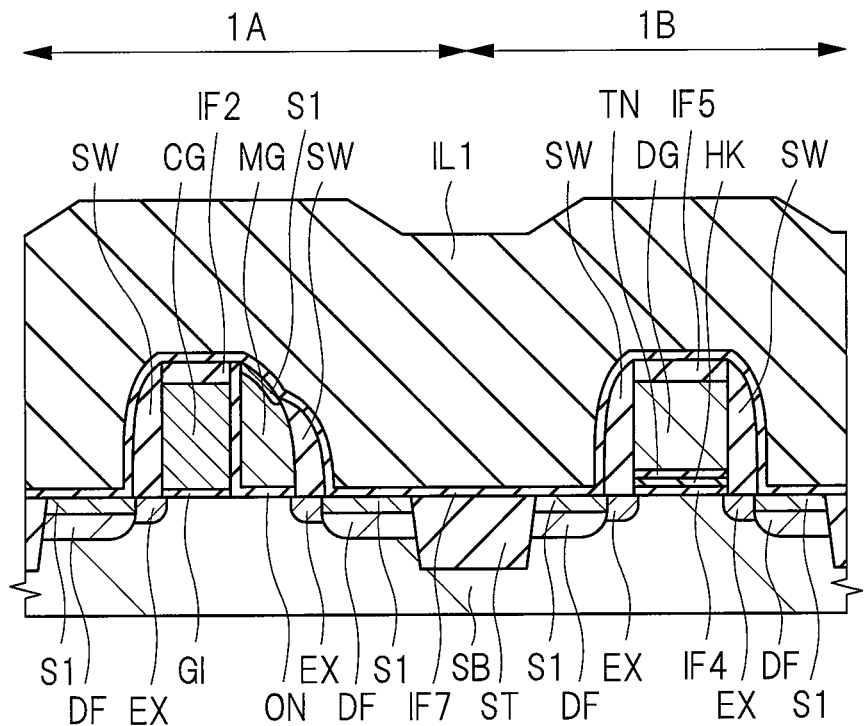
FIG. 16 is a cross-sectional view showing the manufacturing process of the semiconductor device continued from FIG. 15.

Next, as shown in FIG. 16, an insulating film (liner insulating film) IF7 and an interlayer insulating film IL1 are sequentially formed on the entire main surface of the semiconductor substrate SB so as to cover the control gate electrode CG, the memory gate electrode MG, the dummy gate electrode DG and the sidewall SW. The insulating film IF7 is made of, for example, a silicon nitride film and can be formed by, for example, the CVD method. The insulating film IF7 can be used as an etching stopper film at the time when a contact hole is formed in a subsequent process. The interlayer insulating film IL1 is made of, for example, a single film of a silicon oxide film and can be formed by, for example, the CVD method. In this case, the interlayer insulating film IL1 is formed to have a film thickness larger than the film thickness of, for example, the control gate electrode CG.

Figure 17:
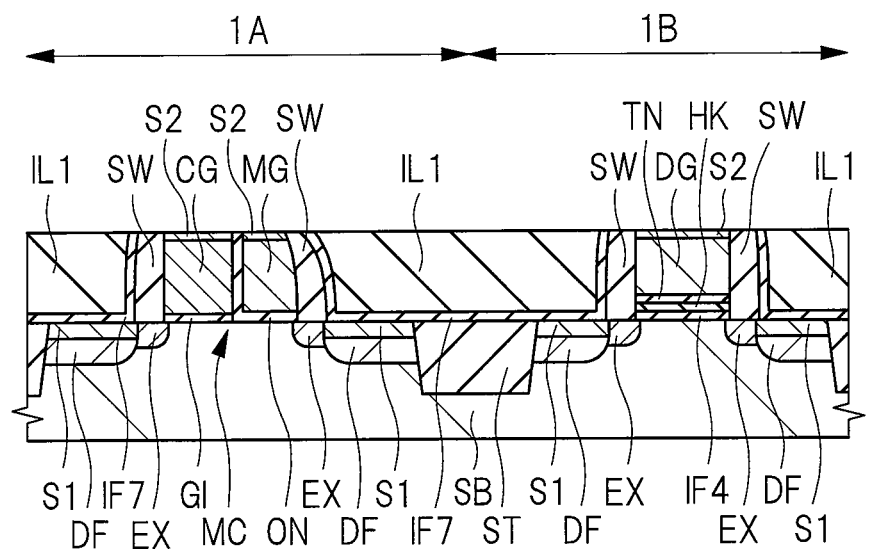
FIG. 17 is a cross-sectional view showing the manufacturing process of the semiconductor device continued from FIG. 16.

Next, as shown in FIG. 17, the upper surface of the interlayer insulating film IL1 is polished by the CMP method. The CMP method is carried out by using a polishing slurry containing an aqueous alkaline solution (alkaline solvent) such as aqueous ammonia.

Thus, the upper surfaces of the control gate electrode CG, the memory gate electrode MG and the dummy gate electrode DG are exposed from the interlayer insulating film IL1 and the insulating film IF7. Namely, in this polishing process, the interlayer insulating film IL1 and the insulating film IF7 are polished until each upper surface of the control gate electrode CG, the memory gate electrode MG and the dummy gate electrode DG is exposed from the interlayer insulating film IL1 and the insulating film IF7. Thus, the insulating films IF2 and IF5 are removed and the upper portions of the sidewall SW and the ONO film ON are also partially removed. In addition, by this process, the silicide layer S1 on the memory gate electrode MG is removed together with a part of the upper portion of the memory gate electrode MG.

Thus, by processing the shapes of the control gate electrode CG and the memory gate electrode MG, a memory cell MC of a split-gate MONOS memory including the control gate electrode CG, the ONO film ON, the memory gate electrode MG and the source/drain regions is formed in the memory cell region 1A. The memory cell MC serving as a MONOS nonvolatile memory element is made up of a control transistor and a memory transistor.

Namely, in the memory cell region 1A, the control gate electrode CG and a pair of source/drain regions formed in the upper surface of the semiconductor substrate SB beside the control gate electrode CG form the control transistor. Moreover, in the memory cell region 1A, the memory gate electrode MG and a pair of source/drain regions formed in the upper surface of the semiconductor substrate SB beside the memory gate electrode MG form the memory transistor. Furthermore, the ONO film ON formed under the memory gate electrode MG constitutes a gate insulating film of the memory transistor. In this manner, the control transistor and the memory transistor share the pair of source/drain regions.

Note that the control transistor is a transistor for memory cell selection, and is thus regarded as a selection transistor.

Therefore, the control gate electrode CG may be regarded as a selection gate electrode. The memory transistor is a transistor for storage.

In this CMP process, the silicide layer S1 on each of the control gate electrode CG and the memory gate electrode MG is polished. Further, in this CMP process, a slurry that contains no acidic solution and contains an aqueous alkaline solution (alkaline solvent) such as aqueous ammonia ($NH_4OH$) is used. For this reason, nickel (Ni) and platinum (Pt) forming the silicide layer S1 are not dissolved in the solution of the slurry, but mixed with the slurry. Thereafter, nickel (Ni) and platinum (Pt) in the slurry are reacted with silicon of each upper surface of the control gate electrode CG, the memory gate electrode MG and the dummy gate electrode DG by heat of less than 70° C. generated by the polishing in the CMP process. By the reaction, a silicide layer S2 is formed on each upper surface of the control gate electrode CG, the memory gate electrode MG and the dummy gate electrode DG.

In other words, immediately after the CMP process, the upper surfaces of the control gate electrode CG, the memory gate electrode MG and the dummy gate electrode DG are covered with the silicide layer S2. The film thickness of the silicide layer S2 is comparatively small, and is smaller than the film thickness of the silicide layer S1. Note that, since the reaction between metal and silicon proceeds from the upper surface toward the lower surface of each of the gate electrodes when the silicide layer S2 is formed, the height of the upper surface of the silicide layer S2 is substantially the same as the height of the upper surfaces of the ONO film ON and the interlayer insulating film IL1.

Figure 18:
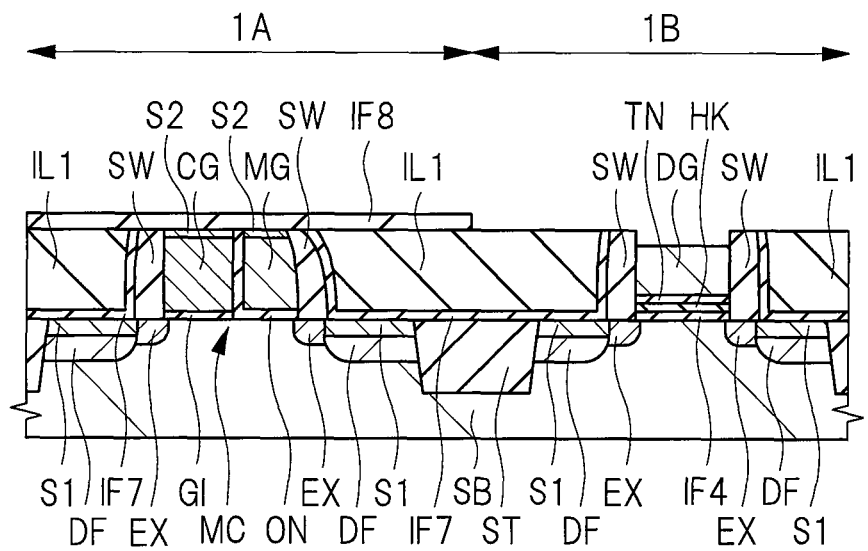
FIG. 18 is a cross-sectional view showing the manufacturing process of the semiconductor device continued from FIG. 17.

Next, as shown in FIG. 18, after an insulating film IF8 is formed on the interlayer insulating film IL1 by, for example, the CVD method, the insulating film IF8 in the peripheral circuit region 1B is removed by using the photolithography technique and the etching method. Thus, the insulating film IF8 is left in the memory cell region 1A. Namely, the insulating film IF8 covers the upper surfaces of the control gate electrode CG and the memory gate electrode MG, and does not cover the upper surface of the dummy gate electrode DG. The insulating film IF8 is made of, for example, a silicon oxide film.

Subsequently, by etching back the upper surface of the dummy gate electrode DG in the peripheral circuit region 1B exposed from the insulating film IF8, the dummy gate electrode DG is retreated. By removing apart of the upper portion of the dummy gate electrode DG in this manner, the film including the silicide layer S2 formed on the upper surface of the dummy gate electrode DG can be removed, so that the dummy gate electrode DG can be easily removed in the etching process to be described later with reference to FIG. 19.

Figure 19:
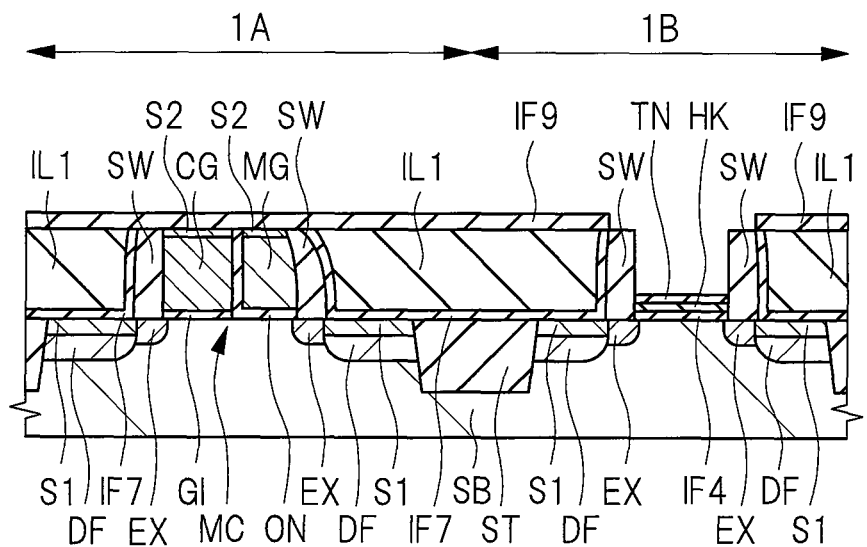
FIG. 19 is a cross-sectional view showing the manufacturing process of the semiconductor device continued from FIG. 18.

Next, as shown in FIG. 19, after an insulating film IF9 is formed on the interlayer insulating film IL1 by using, for example, the CVD method, the insulating film IF9 is processed by using the photolithography technique and the etching method so as to cover the memory cell region 1A and the interlayer insulating film IL1 in the peripheral circuit region 1B. Namely, the insulating film IF9 covers the upper surfaces of the control gate electrode CG and the memory gate electrode MG and does not cover the upper surface of the dummy gate electrode DG. The insulating film IF9 is made of, for example, a silicon oxide film.

Although the illustration thereof is omitted here, the insulating film IF8 (see FIG. 18) may be left without being removed between the insulating film IF9 and the interlayer insulating film ILL Moreover, even if the insulating film IF8 is removed by using ammonia hydrogen peroxide (APM), sulfuric acid hydrogen peroxide (SPM) or the like, the silicide layer S2 is not removed by these solvents. Therefore, even when the insulating film IF8 is removed, the upper surfaces of the control gate electrode CG and the memory gate electrode MG are still covered with the silicide layer S2.

Thereafter, the dummy gate electrode DG is removed by the wet etching method. In this case, the wet etching is carried out by, for example, an aqueous alkaline solution with using the insulating film IF9 as a mask for protecting the control gate electrode CG and the memory gate electrode MG, thereby removing the dummy gate electrode DG. As the aqueous alkaline solution, for example, aqueous ammonia ($NH_4OH$) is used. Since the dummy gate electrode DG has been removed, a trench (concave portion or recessed portion) is formed on the insulating films IF4 and HK constituting the gate insulating film. The trench on the insulating film HK in the peripheral circuit region 1B corresponds to the region from which the dummy gate electrode DG has been removed, and side walls on both sides of the trench are formed of the sidewalls SW.

Figure 20:
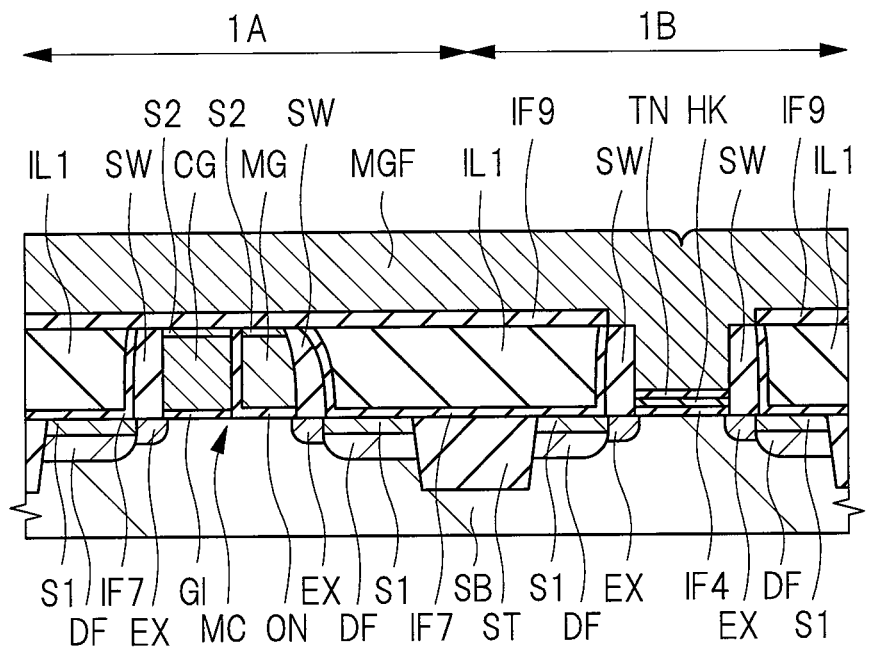
FIG. 20 is a cross-sectional view showing the manufacturing process of the semiconductor device continued from FIG. 19.

Next, as shown in FIG. 20, a metal film MGF serving as a conductive film for the gate electrode is formed on the semiconductor substrate SB, that is, on the interlayer insulating film IL1 including the inner surface (bottom surface and side walls) of the trench so as to completely fill the above-mentioned trench. Note that the metal film MGF is supposed to have a structure made of two or more stacked metal films, but the illustration of interfaces between the two or more metal films is omitted and the metal film MGF is shown as a single film in the drawings.

In the formation process of the metal film MGF, the inside of the above-mentioned trench is completely filled. Moreover, the metal film MGF is formed also on the interlayer insulating film IL1. As the metal film MGF, for example, a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminum (TiAl) film or an aluminum (Al) film can be used. Note that the metal film mentioned here refers to a conductive film having metal conductivity, and is supposed to include not only a metal film (pure metal film) of a single substance or an alloy film, but also a metal compound film having metal conductivity.

In this case, the metal film MGF can be formed of a stacked film of, for example, a titanium nitride (TiN) film and an aluminum (Al) film formed on the titanium nitride film. At this time, the aluminum film is preferably made thicker than the titanium nitride film. Since the aluminum film has a low resistance, it is possible to achieve a resistance reduction of a gate electrode G1 to be formed later.

The aluminum film is formed by the PVD (Physical Vapor Deposition) method, that is, the sputtering method. In this case, the apparatus described with reference to FIG. 13 is used, and the target TG made of aluminum is used. In order to form the aluminum film at a high film forming rate, power to be applied to the target TG is set to a high level. The power is 10 kW of more. Note that any of the film-forming processes by the sputtering method mentioned in the present application is carried out by the PVD method.

Figure 21:
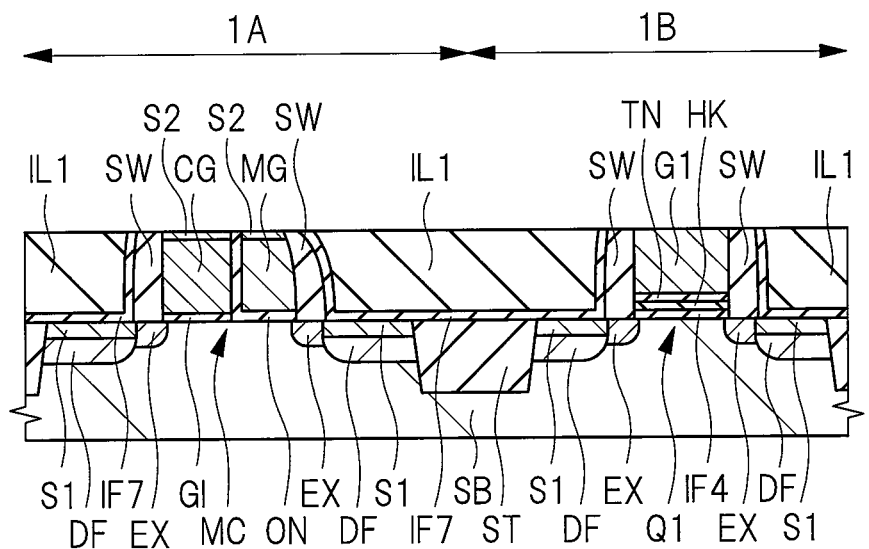
FIG. 21 is a cross-sectional view showing the manufacturing process of the semiconductor device continued from FIG. 20.

Next, as shown in FIG. 21, the respective unnecessary metal film MGF and insulating film IF9 outside the trench are polished and removed by the CMP method or the like, so that the metal film MGF buried in the trench is left. Thus, the control gate electrode CG and the memory gate electrode MG are exposed from the metal film MGF and the insulating film IF9. In the case in which the insulating film IF8 (see FIG. 18) remains, the insulating film IF8 is also removed.

The metal film MGF buried in the trench on the insulating film IF4 in the peripheral circuit region 1B forms the gate electrode G1. Thus, in the peripheral circuit region 1B, a MISFET Q1 is formed. The MISFET Q1 is provided with the gate electrode G1 and source/drain regions beside the gate electrode G1. The MISFET Q1 is a field effect transistor constituting, for example, a peripheral circuit of the memory cell MC.

The insulating film HK and the insulating film IF4 directly under the gate electrode G1 constitute the gate insulating film of the MISFET Q1. The gate electrode G1 is a metal gate electrode. In the present embodiment, the dummy gate electrode DG (see FIG. 18) is removed and replaced by the gate electrode G1. Therefore, the dummy gate electrode DG is a pseudo gate electrode and can be regarded as a gate electrode for replacement.

As described above, in the present embodiment, the MISFET Q1 is formed by using the method in which the dummy gate electrode DG is formed on the semiconductor substrate SB, the source/drain regions are formed in the semiconductor substrate SB, and the dummy gate electrode is then replaced by a metal gate electrode, that is, the gate last process. Moreover, in the present embodiment, a metal gate electrode is used as the gate electrode G1, and it is thus possible to achieve the reduction in size of a transistor element (thickness reduction of gate insulating film).

In this polishing process, the silicide layer S2 is not completely removed. Therefore, the upper surfaces of the control gate electrode CG and the memory gate electrode MG are still covered with the silicide layer S2 even after the polishing process.

Next, as described with reference to FIG. 22 and FIG. 23, a silicide layer is formed on each of the electrodes made of a polysilicon film by carrying out a salicide process. Specifically, the silicide layer can be formed in the following manner.

Figure 22:
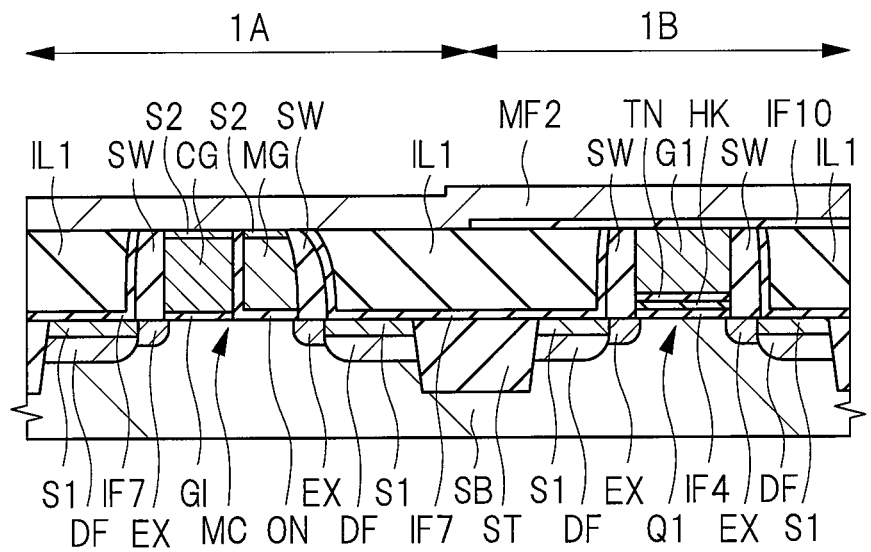
FIG. 22 is a cross-sectional view showing the manufacturing process of the semiconductor device continued from FIG. 21.

That is, as shown in FIG. 22, a pattern of an insulating film IF10 covering the peripheral circuit region 1B is formed by, for example, the CVD method, the photolithography technique and the etching method. The insulating film IF10 covers the gate electrode G1, but does not cover the upper surfaces of the control gate electrode CG and the memory gate electrode MG in the memory cell region 1A, and is made of, for example, a silicon oxide film.

When forming the pattern of the insulating film IF10, for example, after the insulating film IF10 is formed on the interlayer insulating film IL1 by the CVD method, an etching process by the dry etching method is carried out with using a mask (not shown) made of a resist pattern, and a wet etching process is then carried out by using hydrofluoric acid (HF), thereby processing the insulating film IF10. Thus, the upper surfaces of the interlayer insulating film IL1, the ONO film ON, the silicide layer S2, the sidewall SW and others in the memory cell region 1A are exposed. Namely, in the above-mentioned etching process, the silicide layer S2 is not completely removed, and the upper surfaces of the control gate electrode CG and the memory gate electrode MG are still covered with the silicide layer S2.

Subsequently, by carrying out a chemical dry etching process to the main surface of the semiconductor substrate SB as a pretreatment process, an excessive silicon oxide film and the like on the control gate electrode CG and the memory gate electrode MG are removed. However, in this case, the silicide layer S2 is not completely removed. Therefore, the upper surfaces of the control gate electrode CG and the memory gate electrode MG are still covered with the silicide layer S2. Next, a metal film MF2 for forming a silicide layer is formed (deposited) on the entire main surface of the semiconductor substrate SB including the upper surfaces of the control gate electrode CG and the memory gate electrode MG. The film thickness of the metal film MF2 is, for example, 20 to 25 nm.

The metal film MF2 is made of, for example, an alloy film of nickel (Ni) and platinum (Pt) and can be formed by using the sputtering method. The metal film MF2 formed here is an alloy film containing nickel, and a material to be added to nickel in the alloy film is not limited to platinum, and aluminum (Al), carbon(C) or the like may be used. However, platinum has a high heat resistant property in comparison with aluminum, carbon or the like and is thus preferably applied for the alloy film. 5% of the metal film MF2 is made of platinum (Pt).

The metal film MF2 can be formed by the normal sputtering method by using the sputtering apparatus shown in FIG. 13 like the metal film MF1 (see FIG. 14). However, unlike the formation process of the metal film MF1, power to be applied to the target TG shown in FIG. 13 in the sputtering process to be carried out for forming the metal film MF2 is set to 1 kW or more and less than 10 kW. In this case, the metal film MF2 is deposited by driving the sputtering apparatus at the power of, for example, 1 to 5 kW.

In this manner, by carrying out the sputtering with an energy smaller than that used in the sputtering carried out for forming the metal film MF1, it is possible to prevent the silicide layer S2 from being damaged by the sputtering process. Thus, it becomes possible to prevent the upper surfaces of the control gate electrode CG and the memory gate electrode MG from being exposed from the silicide layer S2. Therefore, the metal film MF2 is formed on each of the control gate electrode CG and the memory gate electrode MG, with the silicide layer S2 interposed therebetween.

Figure 23:
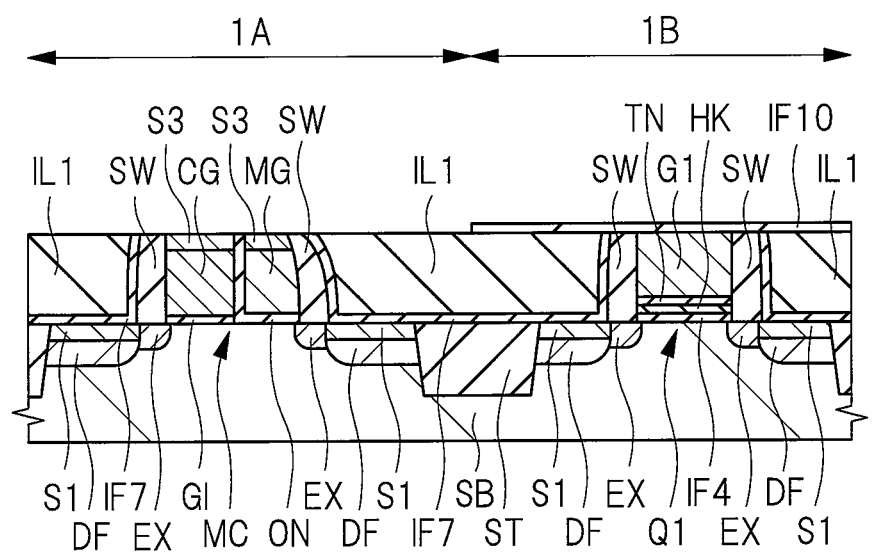
FIG. 23 is a cross-sectional view showing the manufacturing process of the semiconductor device continued from FIG. 22.

Next, as shown in FIG. 23, by carrying out a heat treatment to the semiconductor substrate SB, the surface layer portions of the control gate electrode CG and the memory gate electrode MG are reacted with the metal film MF2. Metal such as nickel (Ni) in the metal film MF2 is reacted with the control gate electrode CG and the memory gate electrode MG even when the silicide layer S2 is formed on each of the control gate electrode CG and the memory gate electrode MG.

By this silicidation, a silicide layer S3 is formed on each upper portion of the control gate electrode CG and the memory gate electrode MG. Moreover, the metal film MF2 which is unreacted even by the above-mentioned heat treatment is removed by the wet etching or the like. At this time, the gate electrode G1 made of a metal film is not removed because it is protected by the insulating film IF10. Note that the silicide layer S2 and the silicide layer S3 are shown as a single layer in the drawing.

The film thickness of the silicide layer S3 formed by the silicidation process is larger than the film thickness of the silicide layer S2. In other words, the film thickness of the silicide layer S2 formed on each upper surface of the control gate electrode CG and the memory gate electrode MG in the polishing process described with reference to FIG. 17 is smaller than that of the silicide layer S3 formed in the silicidation process described with reference to FIG. 23.

In this heat treatment, a heat treatment apparatus which applies heat to the semiconductor substrate by a carbon heater is used. In this case, the heat treatment includes two heat treatment processes. Namely, in the first heat treatment process, a silicide layer S3 containing fine crystals of NiSi and $Ni_2Si$ is formed by the heating, for example, at 260° C. for 30 to 120 seconds. Then, after the unreacted metal film MF2 is removed by the wet etching or the like as described above, NiSi crystals in the silicide layer S3 are grown by the heating at 400° C. for 10 to 120 seconds in the second heat treatment process. The silicide layer S3 formed in this manner is made of, for example, nickel platinum (NiPt) silicide.

Figure 24:
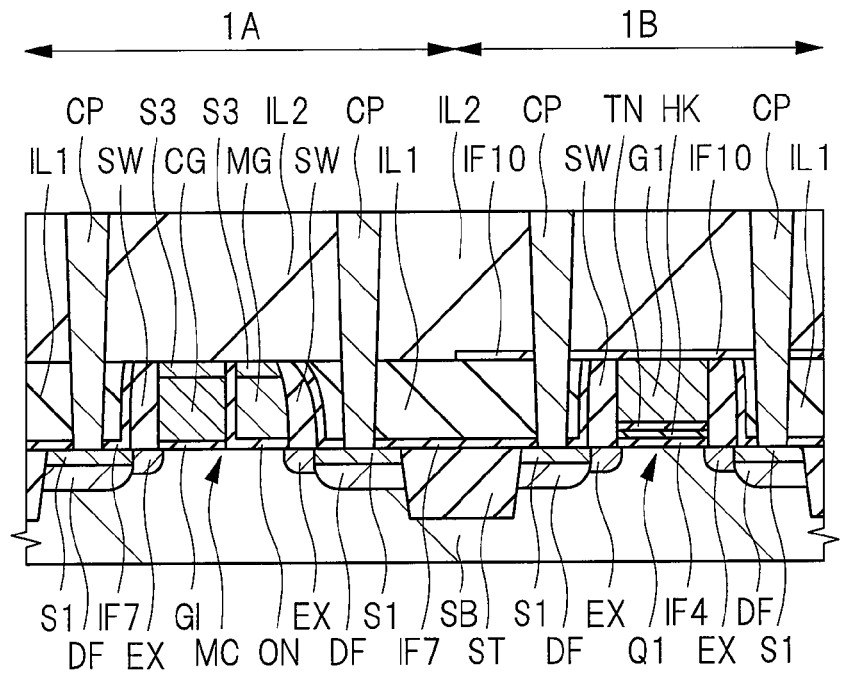
FIG. 24 is a cross-sectional view showing the manufacturing process of the semiconductor device continued from FIG. 23.

Next, as shown in FIG. 24, an interlayer insulating film and a plurality of contact plugs are formed. In this case, an interlayer insulating film IL2 which covers the entire upper surface of the semiconductor substrate SB including the memory cell region 1A and the peripheral circuit region 1B is first formed by using, for example, the CVD method. The interlayer insulating film IL2 is made of, for example, a silicon oxide film, and covers the upper surfaces of the control gate electrode CG, the memory gate electrode MG, the gate electrode G1 and the interlayer insulating film IL1.

Subsequently, a dry etching process is carried out to the interlayer insulating films IL2 and IL1 and the insulating films IF10 and IF7 with using a resist film (not shown) formed on the interlayer insulating film IL2 by using the photolithography technique as an etching mask. Thus, a plurality of contact holes (openings, through holes) that penetrate the interlayer insulating film IL2 and a plurality of contact holes that penetrate the interlayer insulating films IL1 and IL2 and the insulating film IF7 are formed. Note that the contact hole in the peripheral circuit region 1B penetrates the insulating film IF10.

A part of the main surface of the semiconductor substrate SB, for example, a part of the silicide layer S1 on the surface of the diffusion region DF, a part of the silicide layer S3 on the surface of the control gate electrode CG, a part of the silicide layer S3 on the surface of the memory gate electrode MG or a part of the gate electrode G1 is exposed at each bottom of the contact holes. Note that the contact hole on each gate electrode is formed in a region not shown in FIG. 24.

Next, conductive contact plugs CP made of tungsten (W) or the like are formed in the contact holes as conductors for connection. In the formation of the contact plugs CP, for example, a barrier conductor film (for example, a titanium film, a titanium nitride film or a stacked film of these films) is first formed on the interlayer insulating film IL2 including the insides of the contact holes. Then, after a main conductor film made of a tungsten film or the like is formed on the burrier conductor film so as to completely fill the inside of each contact hole, unnecessary main conductor film and barrier conductor film outside the contact holes are removed by the CMP method, the etch back method or the like, thereby forming the contact plugs CP. Note that, for simplicity of the drawing, the barrier conductor film and the main conductor film (tungsten film) constituting the contact plug CP are shown as a single film in FIG. 24.

The contact plugs CP buried in the contact holes are formed so as to be connected to the upper portions of the diffusion region DF, the control gate electrode CG, the memory gate electrode MG and the gate electrode G1, respectively. Namely, the contact plug CP is connected to each upper surface of the diffusion regions DF of the memory cell MC and the MISFET Q1 with the silicide layer S1 interposed therebetween. Moreover, the contact plug CP is connected to each upper surface of the control gate electrode CG and the memory gate electrode MG with the silicide layer S3 interposed therebetween.

One of the purposes of providing the silicide layers S1 and S2 is to reduce a contact resistance between the contact plug CP and each of the diffusion region DF made of semiconductor, the control gate electrode CG and the memory gate electrode MG. Therefore, no silicide layer is provided between the gate electrode G1 serving as a metal gate electrode and the contact plug CP.

Figure 25:
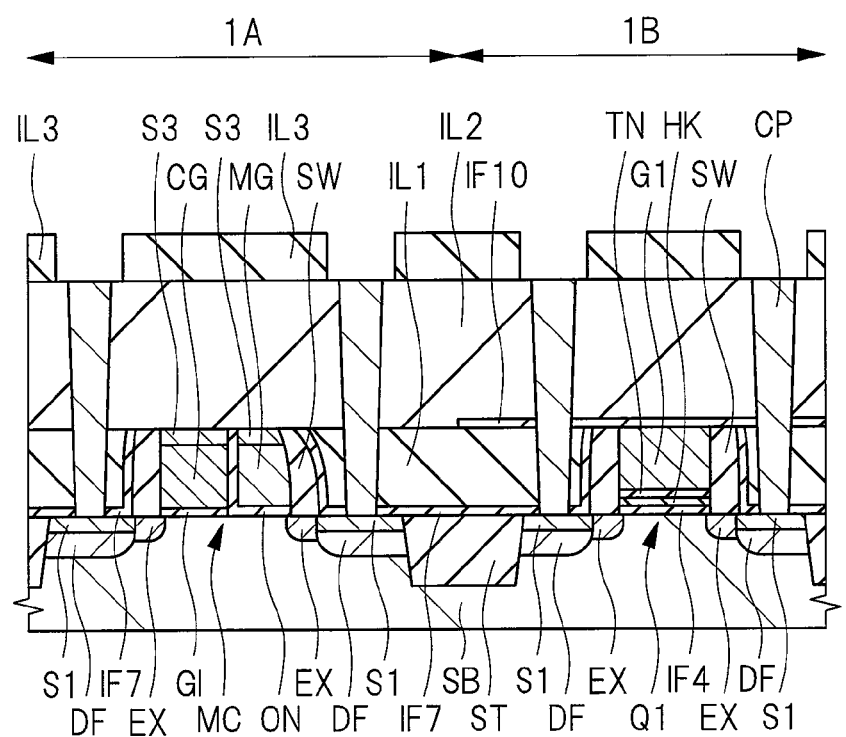
FIG. 25 is a cross-sectional view showing the manufacturing process of the semiconductor device continued from FIG. 24.

Next, as shown in FIG. 25, an interlayer insulating film IL3 is formed (deposited) on the interlayer insulating film IL2 by using, for example, the CVD method. The interlayer insulating film IL3 is made of, for example, a silicon oxide film. Subsequently, the interlayer insulating film IL3 is processed by using the photolithography technique and the dry etching method. Thus, openings are formed in the interlayer insulating film IL3, so that a plurality of trenches (wiring trenches) through which the upper surfaces of the contact plugs CP are exposed are formed.

Figure 26:
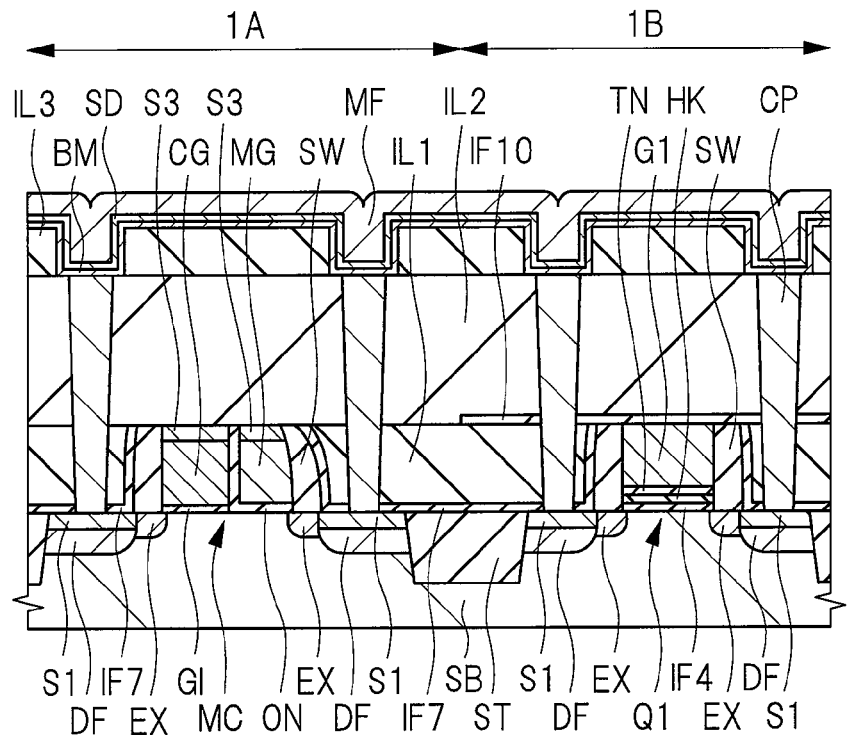
FIG. 26 is a cross-sectional view showing the manufacturing process of the semiconductor device continued from FIG. 25.

Next, as shown in FIG. 26, a burrier conductor film BM and a seed film SD are sequentially formed on the interlayer insulating films IL2 and IL3 and the contact plugs CP by using the sputtering method. Even when the barrier conductor film BM and the seed film SD are formed in this manner, the plurality of trenches opened in the interlayer insulating film IL3 are not completely filled. The barrier conductor film BM is made of, for example, tantalum (Ta), tantalum nitride (TaN) or the like, and the seed layer is made of copper (Cu).

The barrier conductor film BM and the seed film SD are deposited by using the sputtering apparatus described with reference to FIG. 13. When forming the barrier conductor film BM, the target TG (see FIG. 13) made of tantalum (Ta) is used. Moreover, the barrier conductor film BM containing tantalum nitride (TaN) can be formed by carrying out the sputtering process by supplying nitrogen gas ($N_2$) together with argon gas (Ar) into the chamber CHMS (see FIG. 13). When the seed film SD is formed, the target TG (see FIG. 13) made of copper (Cu) is used.

When forming the barrier conductor film BM and the seed film SD, power from the DC power source to be supplied to the target TG shown in FIG. 13 is, for example, 30 kW. Namely, the sputtering process is carried out with the energy larger than the power supplied to the target TG at the time of the formation of the silicide layers S1 and S3.

Subsequently, a main conductor film MF having a large film thickness is formed on the seed film SD by using the plating method. The main conductor film MF is made of, for example, copper (Cu). Thus, each of the plurality of trenches opened in the interlayer insulating film IL3 is completely filled with a stacked film composed of the barrier conductor film BM, the seed film SD and the main conductor film MF.

Figure 27:
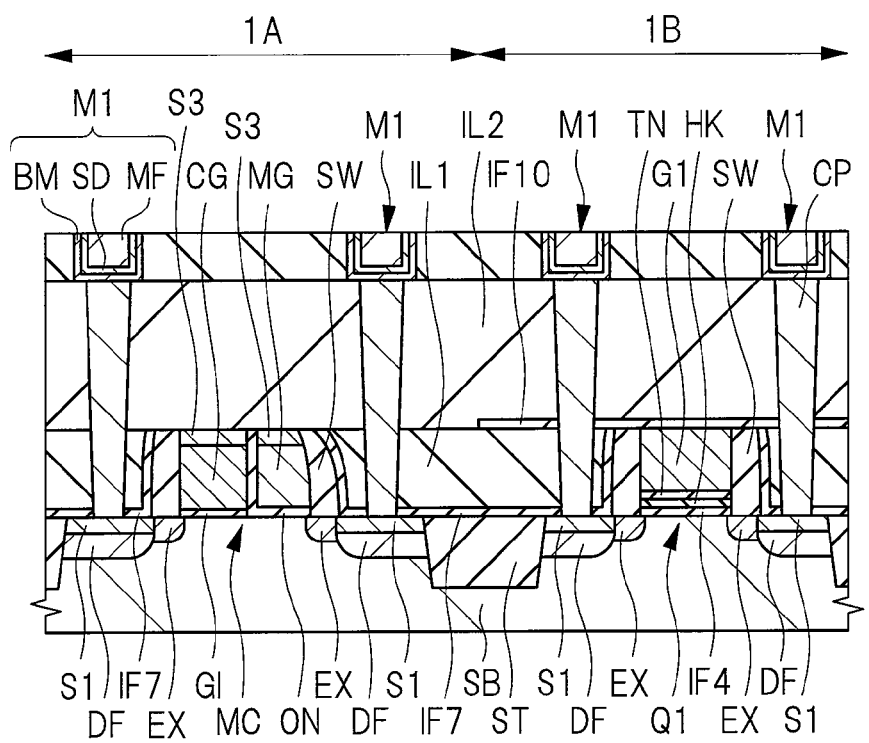
FIG. 27 is a cross-sectional view showing the manufacturing process of the semiconductor device continued from FIG. 26.

Next, as shown in FIG. 27, by removing excessive barrier conductor film BM, seed film SD and main conductor film MF on the interlayer insulating film IL3 by the CMP method or the like, the upper surface of the interlayer insulating film IL3 is exposed. Thus, a wiring M1 composed of the burrier conductor film BM, the seed film SD and the main conductor film MF that are buried in each of the plurality of trenches (wiring trenches) of the interlayer insulating film IL3 is formed. The wiring M1 and the interlayer insulating film IL3 constitute a first wiring layer. The barrier conductor film BM has a function to prevent the copper forming the wiring buried in the trench of the interlayer insulating film IL3 from diffusing into an insulating film around the wiring M1 such as the interlayer insulating film IL3.

The plurality of wrings M1 of the first layer are electrically connected to the upper surfaces of the contact plugs CP. Then, after a second wiring layer, a third wiring layer and the like are sequentially formed on the first wiring layer to form a stacked wiring layer, the semiconductor wafer is divided into individual pieces by a dicing process to obtain a plurality of semiconductor chips. In the manner described above, the semiconductor device of the present embodiment is manufactured.

<Operation of Nonvolatile Memory>

Next, an example of the operation of a nonvolatile memory will be described with reference to FIG. 28.

The memory cell of the present embodiment has a MISFET structure. A charge accumulation state in a trapping insulating film inside the gate electrode of the MISFET is stored as storage information, and the information is read out as a threshold value of the transistor. The trapping insulating film refers to an insulating film capable of accumulating a charge and includes, for example, a silicon nitride film. By using such injection and emission of a charge to and from the charge accumulation region, the threshold value of the MISFET is shifted to achieve the operation as a storage element. As the nonvolatile semiconductor storage device using the trapping insulating film, a split-gate MONOS memory like the memory cell of the present embodiment has been known.

FIG. 28 is a table showing one example of application conditions of voltage to respective portions of a selected memory cell in "writing", "erasing" and "reading" operations in the present embodiment. The table of FIG. 28 shows a voltage Vmg to be applied to the memory gate electrode MG, a voltage Vs to be applied to the source region, a voltage Vcg to be applied to the control gate electrode CG, a voltage Vd to be applied to the drain region, and a base voltage Vb to be applied to a p-type well in the upper surface of the semiconductor substrate in the memory cell MC shown in FIG. 27 in each of the "writing", "erasing" and "reading" operations. The selected memory cell mentioned here refers to a memory cell selected as an object for the "writing", "erasing" or "reading" operation.

In the example of a nonvolatile memory shown in FIG. 27, an active region on the right side of the memory gate electrode MG corresponds to the source region, and an active region on the left side of the control gate electrode CG corresponds to the drain region. Moreover, values shown in the table of FIG. 28 are examples of preferable application conditions of voltage, and the present invention is not limited to these, and various modifications may be made as needed. Furthermore, in the present embodiment, injection of electrons into the silicon nitride film NT (see FIG. 3) serving as the charge accumulation part in the ONO film ON in the memory transistor is defined as "writing", and injection of holes (positive holes) thereto is defined as "erasing".

Moreover, in the table of FIG. 28, a row A corresponds to a case in which the SSI method is used as a writing method and the BTBT method is used as an erasing method, a row B corresponds to a case in which the SSI method is used as the writing method and the FN method is used as the erasing method, a row C corresponds to a case in which the FN method is used as the writing method and the BTBT method is used as the erasing method, and a row D corresponds to a case in which the FN method is used as the writing method and the FN method is used as the erasing method.

The SSI method can be regarded as an operation method in which a writing operation in the memory cell is carried out by injecting hot electrons into the silicon nitride film NT, the BTBT method can be regarded as an operation method in which an erasing operation in the memory cell is carried out by injecting hot holes into the silicon nitride film NT, and the FN method can be regarded as an operation method in which a writing or erasing operation is carried out by the tunneling effect of electrons or holes. When the FN method is expressed in another way, the writing operation of the FN method can be regarded as an operation method in which the writing operation in the memory cell is carried out by injecting electrons into the silicon nitride film FN by the FN tunneling effect, and the erasing operation of the FN method can be regarded as an operation method in which the erasing operation in the memory cell is carried out by injecting holes into the silicon nitride film FN by the FN tunneling effect. The specific descriptions thereof will be given below.

The writing method includes a writing method (hot electron injection writing method) in which a writing operation is carried out by hot electron injection by the source side injection referred to as a so-called SSI (Source Side Injection) method and a writing method (tunneling writing method) in which a writing operation is carried out by FN (Fowler Nordheim) tunneling referred to as a so-called FN method.

In the writing operation of the SSI method, for example, voltages (Vmg=10V, Vs=5V, Vcg=1V, Vd=0.5V, Vb=0V) in the column of "writing operation voltage" corresponding to the row A or the row B of the table in FIG. 28 are applied to the respective portions of a selected memory cell to be subjected to a writing operation, and the writing operation is carried out by injecting electrons into the silicon nitride film NT in the ONO film ON of the selected memory cell.

At this time, hot electrons are generated in the channel region (between source and drain) under the two gate electrodes (the memory gate electrode MG and the control gate electrode CG), and the hot electrons are injected into the silicon nitride film NT serving as the charge accumulation part in the ONO film ON under the memory gate electrode MG. The injected hot electrons (electrons) are captured by a trap level in the silicon nitride film NT in the ONO film ON, with the result that the threshold voltage of the memory transistor is raised. Namely, the memory transistor is brought into a writing state.

In the writing operation of the FN method, for example, voltages (Vmg=−12V, Vs=0V, Vcg=0V, Vd=0V, Vb=0V) in the column of "writing operation voltage" corresponding to the row C or the row D of the table in FIG. 28 are applied to the respective portions of a selected memory cell to be subjected to a writing operation, and the writing operation is carried out by allowing electrons to tunnel from the memory gate electrode MG so as to be injected into the silicon nitride film NT in the ONO film ON in the selected memory cell . At this time, electrons tunnel through the silicon oxide film OX2 (see FIG. 3) by the FN tunneling (FN tunneling effect) from the memory gate electrode MG and are injected into the ONO film ON, and are then captured by a trap level in the silicon nitride film NT in the ONO film ON, with the result that the threshold voltage of the memory transistor is raised. Namely, the memory transistor is brought into a writing state.

Incidentally, in the writing operation of the FN method, the writing operation can be carried out also by allowing electrons to tunnel from the semiconductor substrate SB so as to be injected into the silicon nitride film NT in the ONO film ON, and the writing operation voltages in this case can be obtained by, for example, inverting the polarity of the "writing operation voltage" in the row C or the row D of the table in FIG. 28.

The erasing method includes an erasing method (hot hole injection erasing method) in which an erasing operation is carried out by hot hole injection by BTBT (Band-To-Band Tunneling: Band-To-Band Tunneling Phenomenon) referred to as a so-called BTBT method and an erasing method (tunneling erasing method) in which an erasing operation is carried out by FN (Fowler Nordheim) tunneling referred to as a so-called FN method.

In the erasing operation of the BTBT method, an erasing operation is carried out by injecting holes (positive holes) generated by BTBT into a charge accumulation part (silicon nitride film NT in ONO film ON). For example, voltages (Vmg=−6V, Vs=6V, Vcg=0V, Vd=open, Vb=0V) in the column of "erasing operation voltage" corresponding to the row A or the row C of the table in FIG. 28 are applied to the respective portions of a selected memory cell to be subjected to an erasing operation. Thus, holes generated by the BTBT phenomenon are accelerated by the electric field, and are then injected into the silicon nitride film NT in the ONO film ON of the selected memory cell, so that the threshold voltage of the memory transistor is lowered. Namely, the memory transistor is brought into an erasing state.

In the erasing operation of the FN method, for example, voltages (Vmg=12V, Vs=0V, Vcg=0V, Vd=0V, Vb=0V) in the column of "erasing operation voltage" corresponding to the row B or the row D of the table in FIG. 28 are applied to the respective portions of a selected memory cell to be subjected to an erasing operation, and the erasing operation is carried out by allowing holes to tunnel from the memory gate electrode MG so as to be injected into the silicon nitride film NT in the ONO film ON in the selected memory cell. At this time, holes tunnel through the silicon oxide film OX2 (see FIG. 3) by the FN tunneling (FN tunneling effect) from the memory gate electrode MG and are injected into the ONO film ON, and are then captured by a trap level in the silicon nitride film NT in the ONO film ON, with the result that the threshold voltage of the memory transistor is lowered. Namely, the memory transistor is brought into an erasing state.

Incidentally, in the erasing operation of the FN method, the erasing operation can be carried out also by allowing holes to tunnel from the semiconductor substrate SB so as to be injected into the silicon nitride film NT in the ONO film ON, and the erasing operation voltages in this case can be obtained by, for example, inverting the polarity of the "erasing operation voltage" in the row B or the row D of the table in FIG. 28.

At the time of reading operation, for example, voltages in the column of "reading operation voltage" corresponding to the row A, the row B, the row C or the row D of the table in FIG. 28 are applied to the respective portions of a selected memory cell to be subjected to a reading operation. By setting the voltage Vmg to be applied to the memory gate electrode MG at the time of reading to a value between the threshold voltage of the memory transistor in the writing state and the threshold voltage thereof in the erasing state, the writing state and the erasing state can be discriminated.

<Effects of Present Embodiment>

Figure 49:
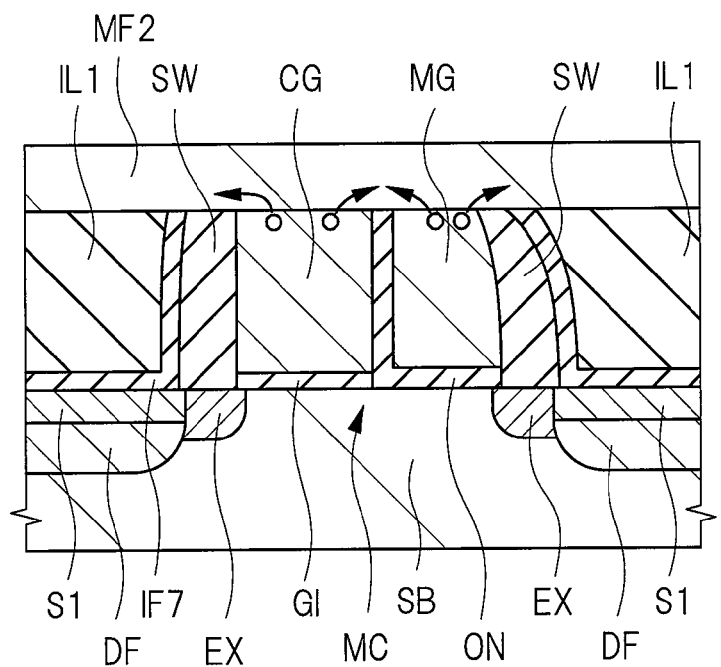
FIG. 49 is a cross-sectional view showing a manufacturing process of a semiconductor device in a modified example.
Figure 50:
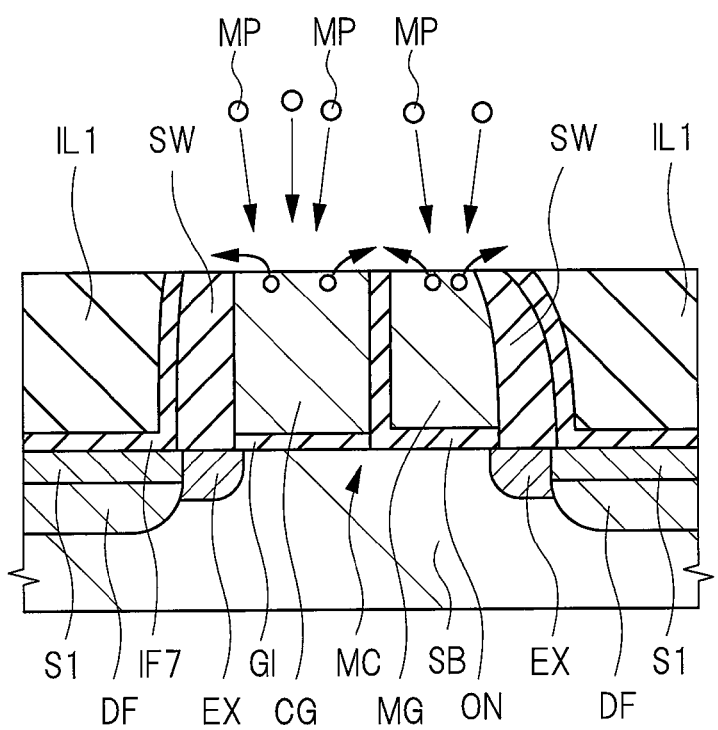
FIG. 50 is a cross-sectional view showing a manufacturing process of a semiconductor device in a modified example.
Figure 51:
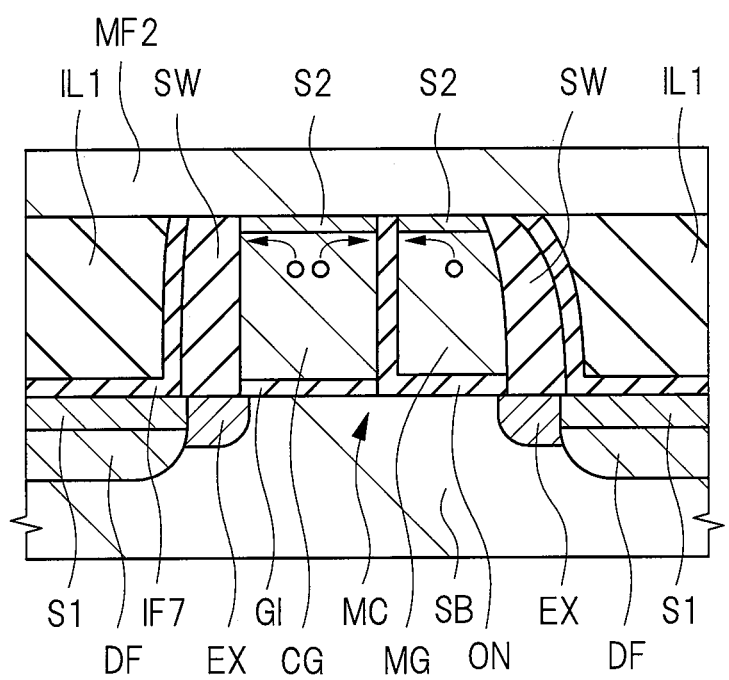
FIG. 51 is a cross-sectional view showing the manufacturing process of the semiconductor device according to the first embodiment.

Effects of the manufacturing method and the semiconductor device according to the present embodiment will be described below with reference to FIG. 49 to FIG. 51. FIG. 49 and FIG. 50 are cross-sectional views showing a manufacturing process of a semiconductor device according to a comparative example. FIG. 51 is a cross-sectional view showing the manufacturing process of the semiconductor device according to the present embodiment.

In the MONOS memory, it is possible to reduce the resistance of the gate electrode by using a silicide layer on the gate electrode as a wiring. However, in the case in which the gate electrode of a transistor constituting a logic circuit or the like in a peripheral circuit region is formed by replacing a dummy gate electrode made of a semiconductor film by a metal gate electrode, it is necessary to use the gate last process.

In the gate last process, after a silicide layer is formed on each upper surface of the source/drain regions of a transistor, an interlayer insulating film is formed, and a polishing process is then carried out so that the dummy gate electrode and the control gate electrode and the memory gate electrode of a memory cell buried by the interlayer insulating film are exposed from the interlayer insulating film. For this reason, the silicide layer can be formed on the upper surfaces of the control gate electrode and the memory gate electrode of the memory cell by forming a silicide layer again after the polishing process.

Here, FIG. 49 and FIG. 50 show a comparative example corresponding to the case in which a thin silicide layer is not formed on the upper surfaces of the control gate electrode and the memory gate electrode when carrying out the polishing process and the upper surfaces of these electrodes are exposed.

In this case, when a metal film MF2 is deposited on the exposed control gate electrode CG and memory gate electrode MG by the sputtering method as shown in FIG. 49, silicon (Si) forming the control gate electrode CG and the memory gate electrode MG is diffused into the metal film MF2. The silicon is diffused in the upward direction and in the lateral directions inside the metal film MF2. If the heat treatment is carried out in this state so as to react the metal film MF2 with silicon, the metal film MF2 is reacted with the control gate electrode CG and the memory gate electrode MG to form a silicide layer. However, silicon diffused inside the metal film MF2 is also reacted with the metal film MF2 to form a silicide layer.

In this case, since the gap between the control gate electrode CG and the memory gate electrode MG adjacent to each other with the ONO film ON having a small thickness interposed therebetween is small, there is a possibility that the silicide layer formed right above the control gate electrode CG and the silicide layer formed right above the memory gate electrode MG are connected to each other to form an integrated layer. In other words, there is a fear that a short-circuit occurs between the control gate electrode CG and the memory gate electrode MG and the memory cell fails to operate normally.

Moreover, even when the silicide layer formed right above the control gate electrode CG and the silicide layer formed right above the memory gate electrode MG are not in contact with each other, if these silicide layers are formed closely with a small gap right above the ONO film ON, the withstand voltage between the control gate electrode CG and the memory gate electrode MG is lowered, with the result that the memory cell fails to operate normally.

Moreover, the sputtering method is used when forming the metal film MF2, and if the sputtering is carried out by supplying a comparatively high energy such as 10 to 20 kW to the target TG shown in FIG. 13, sputtered metal particles MP collide with the exposed upper surfaces of the control gate electrode CG and the memory gate electrode MG at high speed as shown in FIG. 50. Consequently, silicon (Si) on the upper surfaces of the control gate electrode CG and the memory gate electrode MG scatter in the periphery of the control gate electrode CG and the memory gate electrode MG to be adhered thereto, and the metal film MF2 (see FIG. 49) is deposited thereon. The sputtered metal particles MP are made of, for example, nickel platinum (NiPt).

When a heat treatment is carried out in this state to react the metal film MF2 with silicon, the metal film MF2 is reacted with the control gate electrode CG and the memory gate electrode MG to form a silicide layer, and silicon scattered to be adhered to the upper surface of the ONO film ON located beside the control gate electrode CG and the memory gate electrode MG is also reacted with the metal film MF2 to form a silicide layer.

Also in this case, since the gap between the control gate electrode CG and the memory gate electrode MG that are adjacent to each other with the ONO film ON having a small film thickness interposed therebetween is small, there is a possibility that the silicide layer formed right above the control gate electrode CG and the silicide layer formed right above the memory gate electrode MG are connected to form an integrated layer or are formed closely to each other. In other words, there is a fear that the short-circuit or the reduction in withstand voltage occurs between the control gate electrode CG and the memory gate electrode MG and the memory cell fails to operate normally.

In contrast, in the present embodiment, in the polishing process by the CMP method described with reference to FIG. 17, the interlayer insulating film IL1, the insulating film IF7 and the silicide layer S1 (see FIG. 16) are polished by using a slurry containing an aqueous alkaline solution. For this reason, the thin silicide layer S2 shown in FIG. 17 is formed so as to cover the upper surfaces of the control gate electrode CG and the memory gate electrode MG. When the polishing process is carried out by using a slurry containing an aqueous acidic solution (acidic solvent), since metal forming the silicide layer is dissolved into the aqueous acidic solution, no silicide layer S2 (see FIG. 17) remains after the polishing process as shown in FIG. 49. However, since the polishing is carried out by using the aqueous alkaline solution in this case, the silicide layer S2 is formed.

When the film-forming process of the metal film MF2 shown in FIG. 22 is carried out in the state in which the upper surfaces of the control gate electrode CG and the memory gate electrode MG are covered with the silicide layer S2 as described above, the silicide layer S2 is interposed between the metal film MF2 thus formed and the control gate electrode CG and the memory gate electrode MG. Therefore, as shown in FIG. 51, it is possible to prevent silicon inside each of the control gate electrode CG and the memory gate electrode MG from diffusing into the metal film MF2.

Therefore, even when the silicide layer S3 shown in FIG. 23 is formed by carrying out a heat treatment thereafter, no silicide layer S3 is formed on the ONO film ON. Accordingly, it is possible to prevent the short-circuit between the control gate electrode CG and the memory gate electrode MG through the silicide layer S3 and the reduction in withstand voltage between the control gate electrode CG and the memory gate electrode MG due to the silicide layers 3 formed closely to each other.

Moreover, since the silicide layer S2 functions as a protection film when forming the metal film MF2 shown in FIG. 22 by the sputtering method, it is possible to prevent silicon forming the control gate electrode CG and the memory gate electrode MG from scattering. Therefore, no silicide layer S3 is formed on the ONO film ON when forming the silicide layer S3 by carrying out the heat treatment after the formation of the metal film MF2.

For this reason, it is possible to prevent the short-circuit between the control gate electrode CG and the memory gate electrode MG through the silicide layer S3 and the reduction in withstand voltage between the control gate electrode CG and the memory gate electrode MG due to the silicide layers 3 formed closely to each other.

As described above, it is possible to improve the reliability of the semiconductor device according to the present embodiment.

Moreover, in the present embodiment, the sputtering process to form the metal film MF2 shown in FIG. 22 is carried out by supplying to the target TG an energy lower than the energy supplied to the target TG (see FIG. 13) at the time of the formation of the metal film MF1 (see FIG. 14), the barrier conductor film BM and the seed film SD (see FIG. 25). Therefore, as shown in FIG. 22, the metal film MF2 can be formed on the control gate electrode CG and the memory gate electrode MG with the silicide layer S2 interposed therebetween, without causing damages to the silicide layer S2.

Therefore, in the silicidation process described with reference to FIG. 23, the upper surfaces of the control gate electrode CG and the memory gate electrode MG are neither exposed from the silicide layer S2, nor made in contact with the metal film MF2. Accordingly, it is possible to prevent the diffusion of silicon into the metal film MF2 described with reference to FIG. 49 and also the scattering of silicon by the sputtering process described with reference to FIG. 50. Consequently, it is possible to prevent the short-circuit between the control gate electrode CG and the memory gate electrode MG through the silicide layers S3 on the respective gate electrodes and also the reduction in withstand voltage between the control gate electrode CG and the memory gate electrode MG due to the silicide layers S3 formed closely to each other.

Moreover, the sputtering to form the metal film MF2 shown FIG. 22 may be carried out by supplying to the target TG an energy (for example, 10 to 20 kW) similar to the energy supplied to the target TG (see FIG. 13) at the time of the formation of the metal film MF1 (see FIG. 14). Even in this case, since the upper surfaces of the control gate electrode CG and the memory gate electrode MG shown in FIG. 22 are protected by the silicide layer S2, it is possible to prevent the short-circuit and the reduction in withstand voltage caused by the diffusion and scatting of silicon.

When the metal film MF2 is formed by carrying out the sputtering with a comparatively high energy in this manner, the deposition rate of the metal film MF2 becomes faster, and thus the time required for manufacturing the semiconductor device can be shortened. Namely, the manufacturing cost of the semiconductor device can be reduced.

Moreover, since the silicide layer S2 shown in FIG. 22 is formed by a polishing process and no salicide process for forming the silicide layer S2 is added in the present embodiment, it is possible to prevent the increase of the manufacturing cost of the semiconductor device.

<First Modified Example>

In the above-mentioned embodiment, the case in which the energy to be supplied to the target TG (see FIG. 13) in the sputtering process to form the metal film MF2 shown in FIG. 22 is reduced, thereby preventing the silicide layer S2 from being damaged and also preventing silicon forming each gate electrode of the memory cell region 1A from scattering has been described. On the other hand, as will be described below, the effects of preventing the silicide layer S2 from being damaged and also preventing silicon forming each gate electrode of the memory cell region 1A from scattering can be achieved also by using the collimated sputtering method in which a porous plate is disposed inside the sputtering apparatus.

Figure 29:
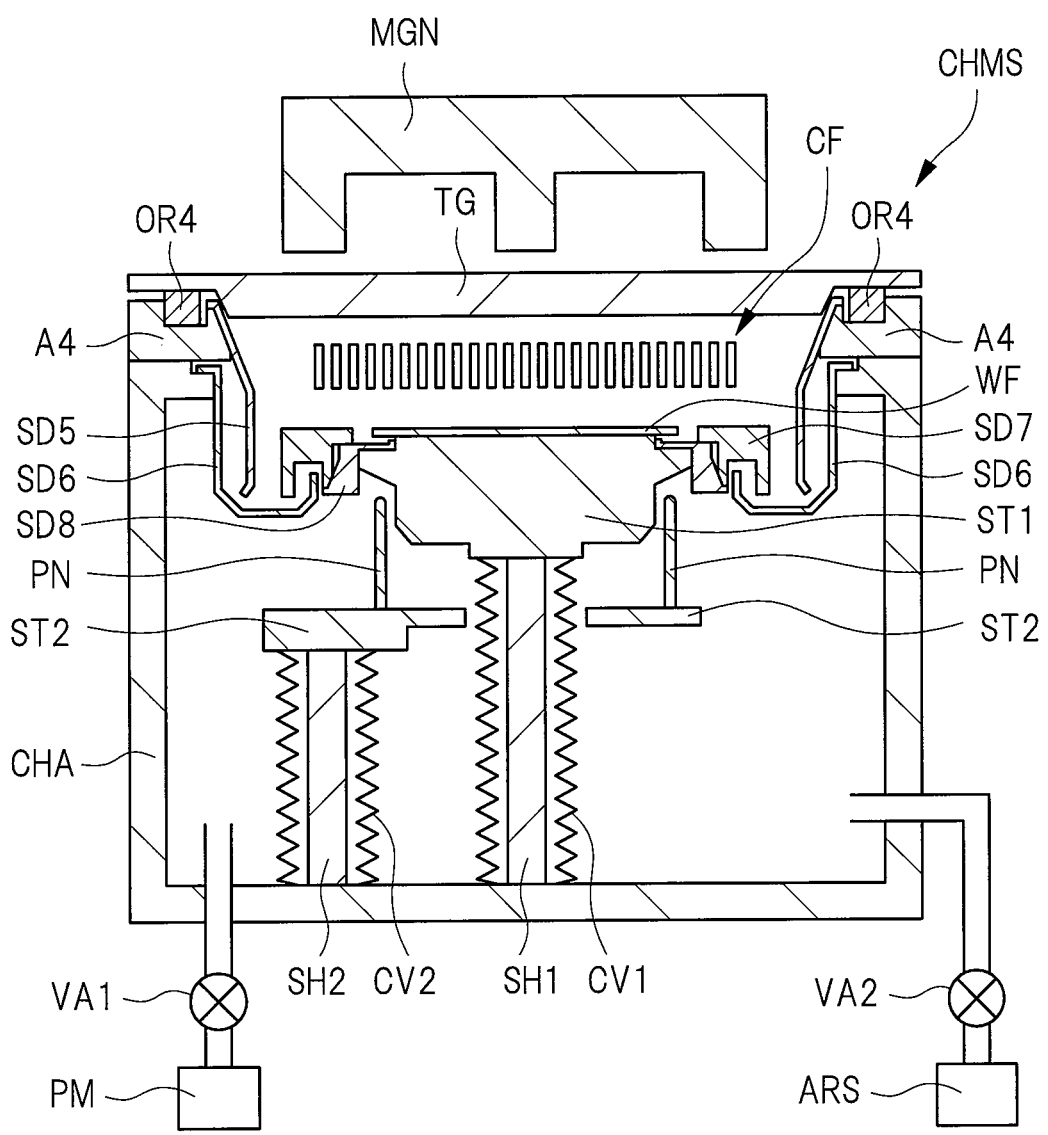
FIG. 29 is a cross-sectional view showing a sputtering apparatus used in a first modified example of the semiconductor device according to the first embodiment.

FIG. 29 shows a cross section of the sputtering apparatus used in the first modified example of the semiconductor device of the present embodiment. The configuration of this sputtering apparatus is almost the same as that of the apparatus described with reference to FIG. 13. However, it differs from the apparatus shown in FIG. 13 in that a porous plate (collimator, collimator plate) CF is disposed between the semiconductor wafer WF and the target TG in the chamber CHMS. The porous plate CF is, for example, a metal plate having a number of holes (through holes) that penetrate from the upper surface to the lower surface, and these many holes respectively extend in a direction perpendicular to the main surface of the semiconductor wafer WF.

In this configuration, metal particles that are sputtered to fly in directions oblique to the main surface of the semiconductor wafer WF are blocked by the lattice-shaped collimator and cannot reach the main surface of the semiconductor wafer WF, and only the metal particles having many components that are perpendicular to the main surface in their flying directions are allowed to reach the semiconductor wafer WF. Thus, even when the sputtering is carried out by supplying the power of, for example, 10 to 20 kW to the target TG, it is possible to prevent the silicide layer S2 shown in FIG. 22 from being damaged by particles that are made incident thereon from oblique directions, and also to prevent silicon forming each gate electrode of the memory cell region 1A from scattering.

Note that, in the sputtering process, particles that are obliquely made incident with respect to the main surface of the semiconductor wafer WF among the metal particles sputtered from the target TG may be captured by adhering them to the porous plate by applying a ground voltage to the porous plate CF.

<Second Modified Example>

In the above-mentioned embodiment, the case in which the energy to be supplied to the target TG (see FIG. 13) in the sputtering process to form the metal film MF2 shown in FIG. 22 is reduced, thereby preventing the silicide layer S2 from being damaged and also preventing silicon forming each gate electrode of the memory cell region 1A from scattering has been described. On the other hand, as will be described below, the effects of preventing the silicide layer S2 from being damaged and also preventing silicon forming each gate electrode of the memory cell region 1A from scattering can be achieved also by using the long throw sputtering method.

Figure 30:
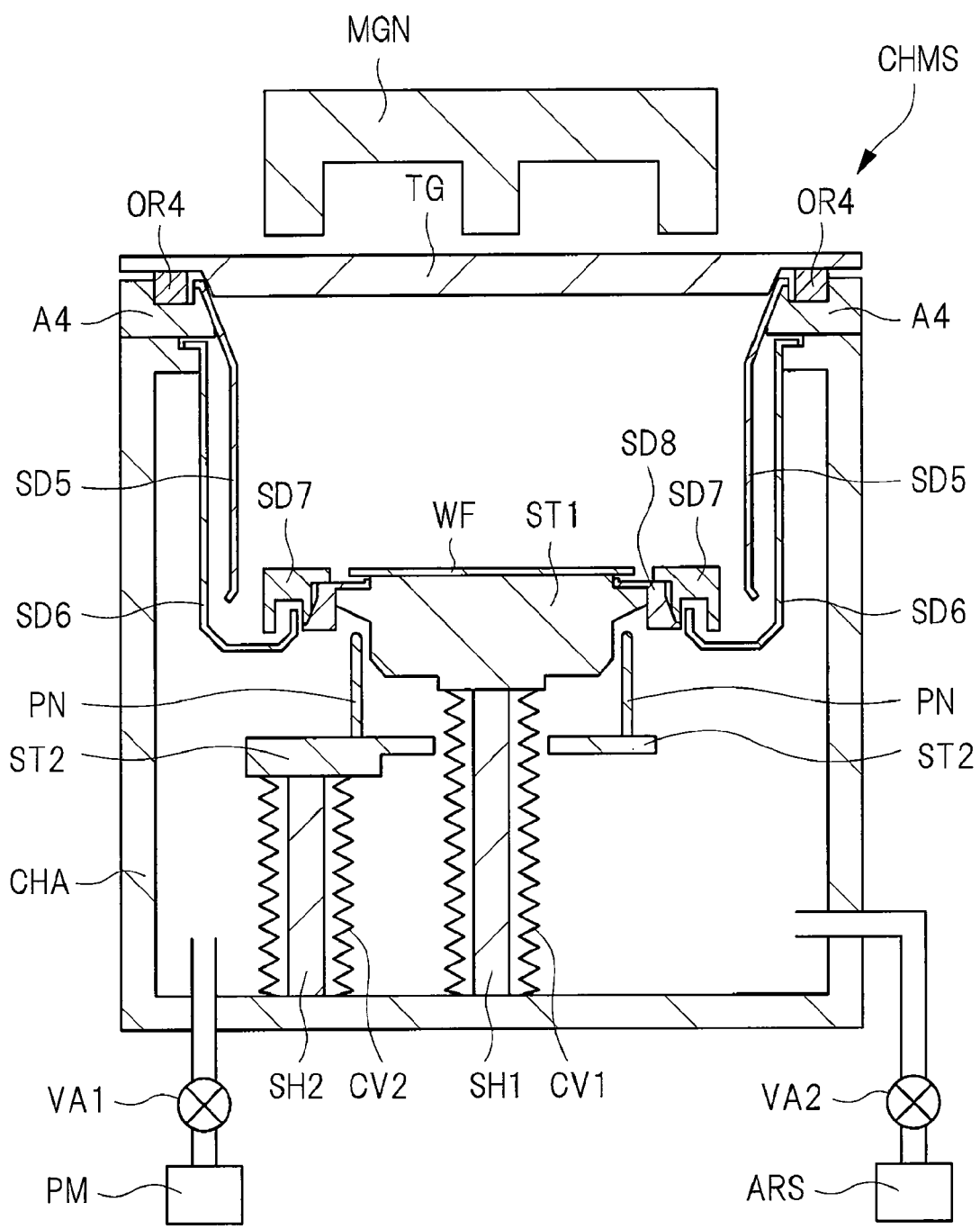
FIG. 30 is a cross-sectional view showing a sputtering apparatus used in a second modified example of the semiconductor device according to the first embodiment.

FIG. 30 shows a cross section of the sputtering apparatus used in the second modified example of the semiconductor device of the present embodiment. FIG. 30 is a cross-sectional view showing the sputtering apparatus used in this modified example. The configuration of this sputtering apparatus is almost the same as that of the apparatus described with reference to FIG. 13. However, it differs from the apparatus shown in FIG. 13 in that the length in the longitudinal direction of the chamber CHMS is larger, that is, the interval between the semiconductor wafer WF and the target TG is increased. Namely, the sputtering apparatus of this modified example is used for carrying out the sputtering process by the long throw sputtering method.

In this configuration, by carrying out the long throw sputtering, particles having many components in oblique directions with respect to the main surface among the flying directions of the sputtered metal particles do not reach the semiconductor wafer WF due to the long interval between the target TG and the semiconductor wafer WF. Therefore, like the above-mentioned first modified example, only the metal particles having many components that are perpendicular to the main surface among the flying directions of the sputtered metal particles are allowed to reach the semiconductor wafer WF.

Thus, even when the sputtering is carried out by supplying the power of, for example, 10 to 20 kW to the target TG, it is possible to prevent the silicide layer S2 shown in FIG. 22 from being damaged by particles that are made incident thereon from oblique directions, and also to prevent silicon forming each gate electrode of the memory cell region 1A from scattering.

Second Embodiment

Hereinafter, the case of preventing the short-circuit between the control gate electrode and the memory gate electrode and the reduction in withstand voltage between these gate electrodes without forming the thin silicide layer S2 (see FIG. 22) by the polishing process unlike the first embodiment will be described with reference to FIG. 31 to FIG. 34. FIG. 31 to FIG. 34 are cross-sectional views for describing the manufacturing process of a semiconductor device according to the present embodiment. FIG. 31 to FIG. 34 show the memory cell region 1A and the peripheral circuit region 1B in the same manner as FIG. 1 and the like.

Figure 31:
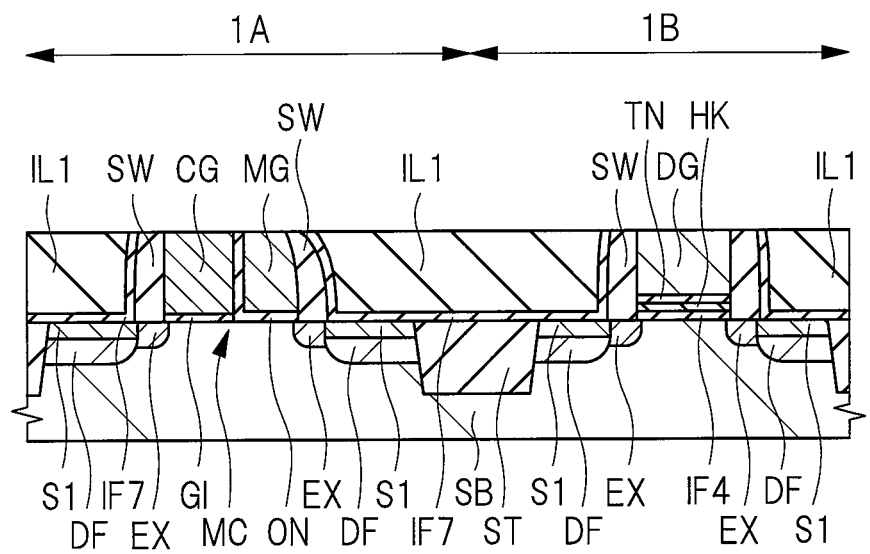
FIG. 31 is a cross-sectional view showing a manufacturing process of a semiconductor device according to the second embodiment.

In the manufacturing process in the present embodiment, after carrying out the processes described with reference to FIG. 1 to FIG. 16, the upper surfaces of the control gate electrode CG, the memory gate electrode MG and the dummy gate electrode DG are exposed by carrying out a polishing process by the CMP method as shown in FIG. 31. In this polishing process, since the polishing process by the CMP method is carried out by using a slurry containing no aqueous alkaline solution, the thin silicide layer S2 (see FIG. 22) is not formed on the gate electrodes.

Figure 32:
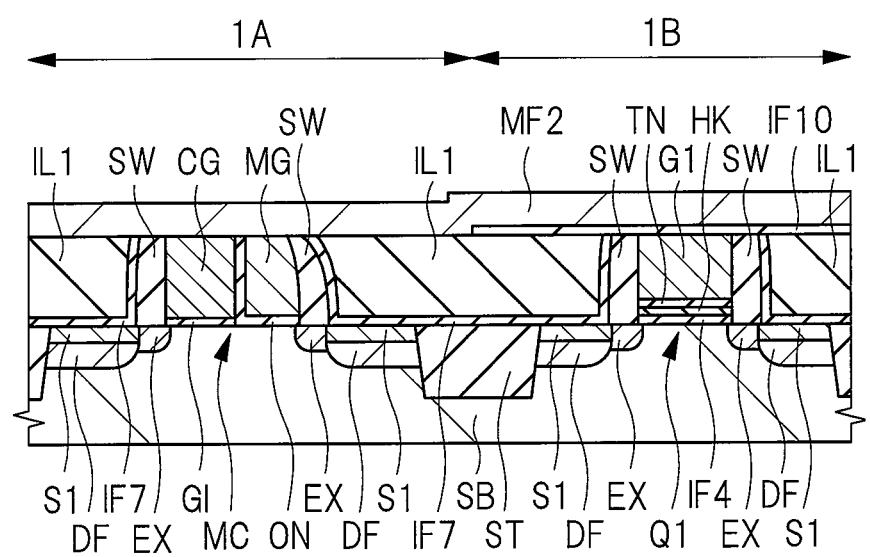
FIG. 32 is a cross-sectional view showing the manufacturing process of the semiconductor device continued from FIG. 31.

Next, as shown in FIG. 32, after carrying out the processes described with reference to FIG. 18 to FIG. 21, a pattern of an insulating film IF10 which does not cover the control gate electrode CG and the memory gate electrode MG and covers the dummy gate electrode DG is formed. Thereafter, by carrying out a sputtering process while supplying the power of 1 kW or more to less than 10 kW to the target TG in the sputtering apparatus described with reference to FIG. 13, the metal film MF2 made of, for example, nickel platinum (NiPt) is formed (deposited) on the interlayer insulating film IL1, the control gate electrode CG, the memory gate electrode MG and the insulating film IF10. In this case, the metal film MF2 is formed in the same manner as the first embodiment.

In other words, in the case in which the above-mentioned sputtering is carried out by using the apparatus shown in FIG. 13, the power to be supplied to the target in the sputtering is smaller than the power supplied to the target in the sputtering to form the barrier conductor film BM and the seed film SD described with reference to FIG. 26.

Alternatively, the apparatus shown in FIG. 29 or FIG. 30 may be used instead of the apparatus shown in FIG. 13. Namely, the metal film MF2 may be formed by the sputtering using the collimated sputtering method described with reference to FIG. 29 or the sputtering using the long throw sputtering method described with reference to FIG. 30.

Specifically, in the case in which the above-mentioned sputtering is carried out by using the apparatus shown in FIG. 30, the distance between the target and the semiconductor wafer in the sputtering is longer than the distance between the target and the semiconductor wafer in the sputtering to form the barrier conductor film BM and the seed film SD described with reference to FIG. 26.

At this time, since the metal film MF2 is deposited on the exposed upper surfaces of the control gate electrode CG and the memory gate electrode MG in FIG. 32, the metal film MF2 is in contact with the upper surfaces of the control gate electrode CG and the memory gate electrode MG.

Figure 33:
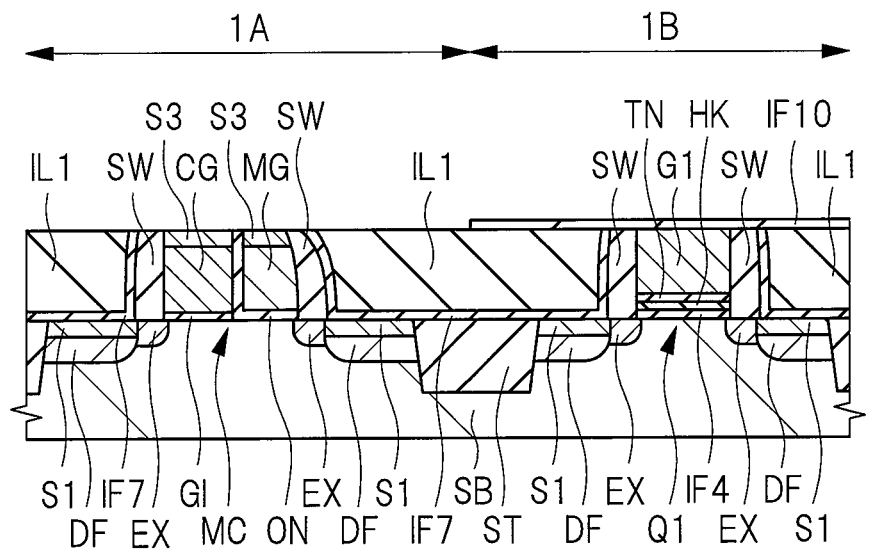
FIG. 33 is a cross-sectional view showing the manufacturing process of the semiconductor device continued from FIG. 32.

Next, as shown in FIG. 33, by carrying out the same silicidation process as that described with reference to FIG. 23, a silicide layer S3 is formed so as to be in contact with the upper surfaces of the control gate electrode CG and the memory gate electrode MG.

Figure 34:
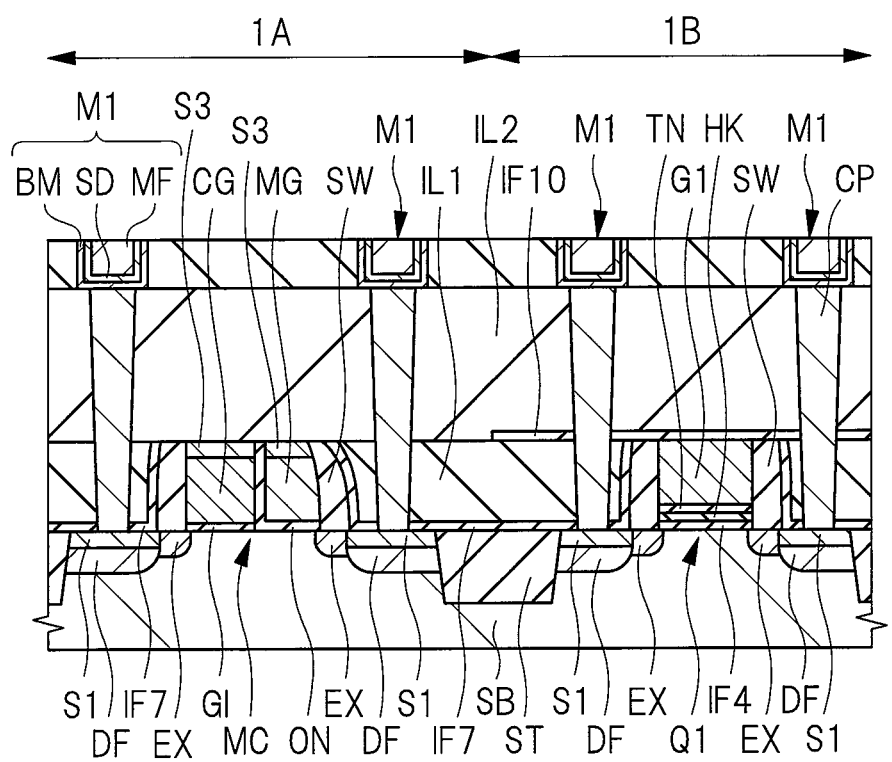
FIG. 34 is a cross-sectional view showing the manufacturing process of the semiconductor device continued from FIG. 33.

Next, as shown in FIG. 34, by carrying out the processes described with reference to FIG. 24 to FIG. 27, the semiconductor device according to the present embodiment is manufactured.

In the present embodiment, when the metal film MF2 (see FIG. 52) is formed by using the apparatus described with reference to FIG. 13, the sputtering is carried out by supplying to the target TG an energy smaller than the energy supplied to the target TG (FIG. 13) when forming the metal film MF1 (see FIG. 14), the barrier conductor film BM and the seed film SD (see FIG. 25). Alternatively, the metal film MF2 (see FIG. 52) is formed by using the apparatus shown in FIG. 29 or FIG. 30.

Therefore, since the energy by which metal particles scattered by the sputtering collide with the upper surfaces of the control gate electrode CG and the memory gate electrode MG can be reduced, the scattering of silicon described with reference to FIG. 50 can be suppressed. Accordingly, in the case in which the silicide layer S3 shown in FIG. 33 is formed, it is possible to prevent the short-circuit between the control gate electrode CG and the memory gate electrode MG through the silicide layers S3 on the respective gate electrodes and also the reduction in withstand voltage between the control gate electrode CG and the memory gate electrode MG due to the silicide layers S3 formed closely to each other.

<Modified Example>

Hereinafter, the case in which the thin silicide layer S2 (see FIG. 17) is not formed in the polishing process as described with reference to FIG. 31 and a salicide process for forming such a thin silicide layer is added will be described with reference to FIG. 35 to FIG. 39. FIG. 35 to FIG. 39 are cross-sectional views for describing the manufacturing process of a semiconductor device according to the present modified example. FIG. 35 to FIG. 39 show the memory cell region 1A and the peripheral circuit region 1B in the same manner as FIG. 1 and the like.

Figure 35:
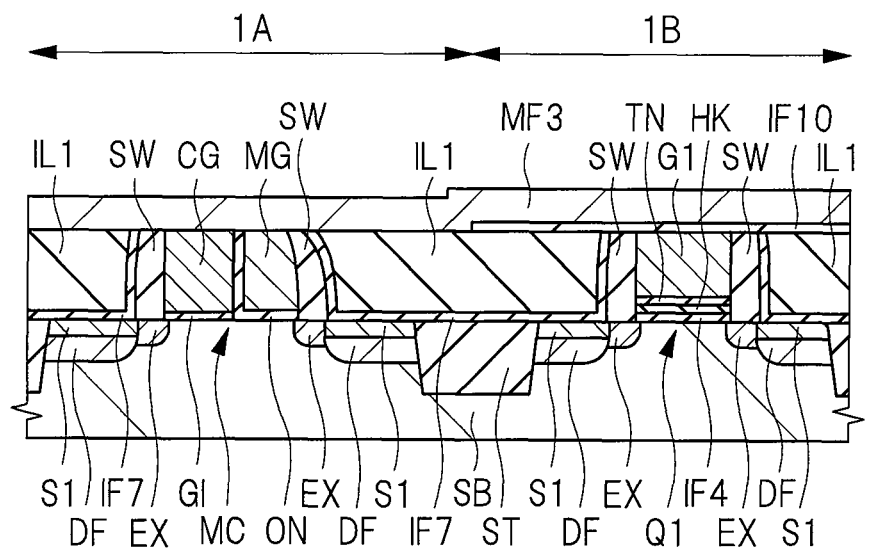
FIG. 35 is a cross-sectional view showing a manufacturing process of a semiconductor device in a modified example of the second embodiment.

In the manufacturing process of this modified example, the process described with reference to FIG. 31 is first carried out and the process described with reference to FIG. 18 to FIG. 21 is then carried out. Thereafter, the insulating film IF10 which does not cover the control gate electrode CG and the memory gate electrode MG and covers the dummy gate electrode DG is formed as shown in FIG. 35, and a metal film MF3 is formed on the semiconductor substrate SB by using the sputtering method.

The metal film MF3 is formed by using the sputtering method with a low energy (see FIG. 13), the collimated sputtering method (see FIG. 29) or the long throw sputtering method (see FIG. 30) like the metal film MF2 shown in FIG. 52. Accordingly, since no silicide layer is formed on the upper surfaces of the control gate electrode CG and the memory gate electrode MG in this case, the metal film MF3 is deposited so as to be in contact with these upper surfaces, but it is possible to prevent silicon of the upper surfaces of the control gate electrode CG and the memory gate electrode MG from scattering due to the sputtering process.

Figure 36:
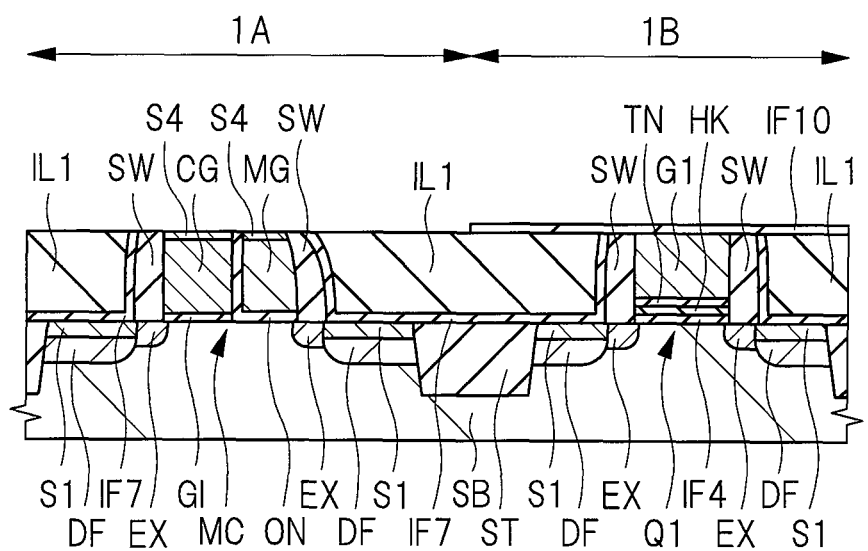
FIG. 36 is a cross-sectional view showing the manufacturing process of the semiconductor device continued from FIG. 35.

Next, as shown in FIG. 36, by heating the semiconductor substrate SB at a low temperature of less than 70° C., the metal film MF3 is reacted with silicon of the upper surfaces of the control gate electrode CG and the memory gate electrode MG, so that a thin silicide layer S4 is formed on the upper surfaces of the control gate electrode CG and the memory gate electrode MG. The film thickness of the silicide layer S4 is smaller than that of the silicide layer S1. Thereafter, unreacted excessive metal film MF3 is removed.

Figure 37:
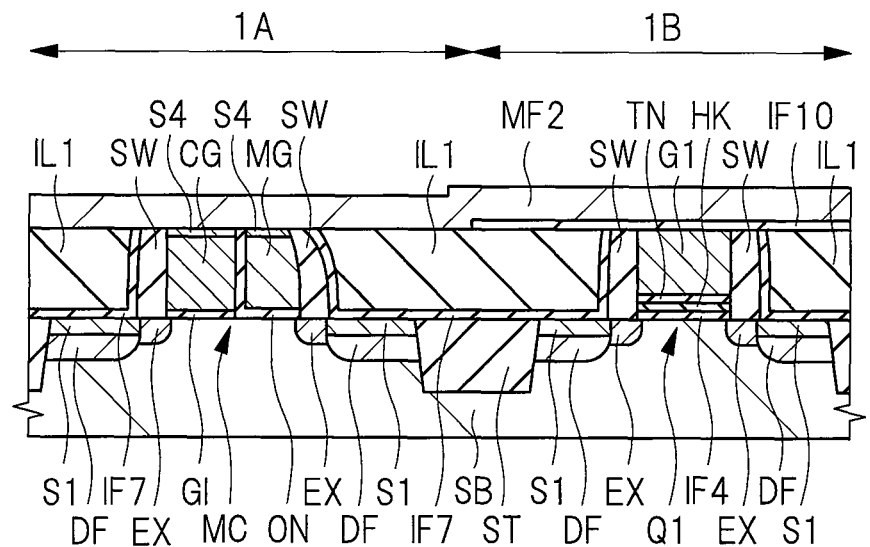
FIG. 37 is a cross-sectional view showing the manufacturing process of the semiconductor device continued from FIG. 36.

Next, as shown in FIG. 37, the same process as the process described with reference to FIG. 22 is carried out to form the metal film MF2 on the interlayer insulating film ILL Namely, it is possible to use the sputtering method with a low energy (see FIG. 13), the collimated sputtering method (see FIG. 29) or the long throw sputtering method (see FIG. 30) in the sputtering process for forming the metal film MF2. Moreover, it is also possible to carry out the sputtering by supplying to the target TG an energy (for example, 10 to 20 kW) similar to the energy to be supplied to the target TG (see FIG. 13) when forming the metal film MF1 (see FIG. 14).

In the case of using the sputtering method with a low energy (see FIG. 13), the collimated sputtering method (see FIG. 29) or the long throw sputtering method (see FIG. 30), it is possible to prevent the silicide layer S4 from being damaged. Moreover, even when the sputtering is carried out by using a high energy of about 10 to 20 kW, since the upper surfaces of the control gate electrode CG and the memory gate electrode MG are protected by the silicide layer S4, it is possible to prevent the short-circuit and the reduction in withstand voltage due to the diffusion and scattering of silicon. In the case where the sputtering is carried out at high energy, the effect of accelerating the deposition rate of the metal film MF2 can be obtained.

Figure 38:
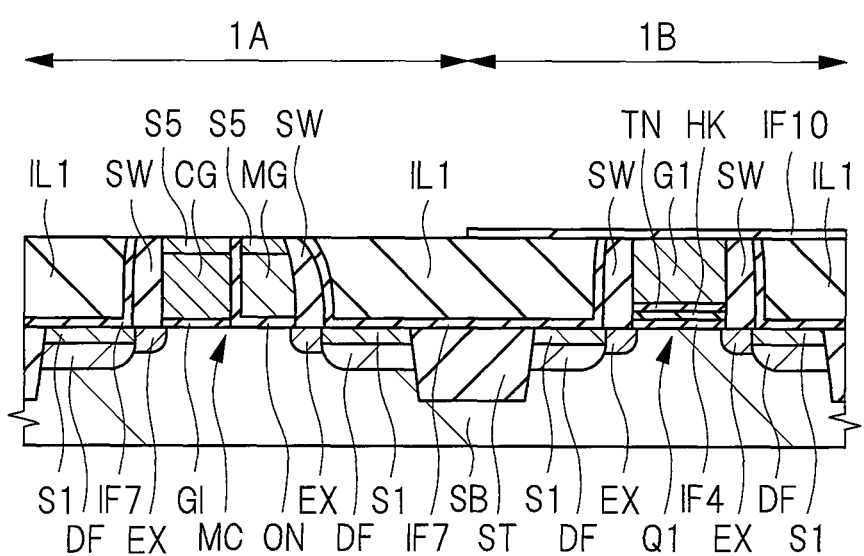
FIG. 38 is a cross-sectional view showing the manufacturing process of the semiconductor device continued from FIG. 37.

Next, as shown in FIG. 38, after forming a silicide layer S5 in contact with the upper surfaces of the control gate electrode CG and the memory gate electrode MG by carrying out a silicidation process by a heat treatment, excessive metal film MF2 is removed. In this case, the silicide layer S4 is integrally formed with the silicide layer S5 and the illustration thereof is omitted. Namely, the thickness of the silicide layer S5 is larger than that of the silicide layer S4.

Figure 39:
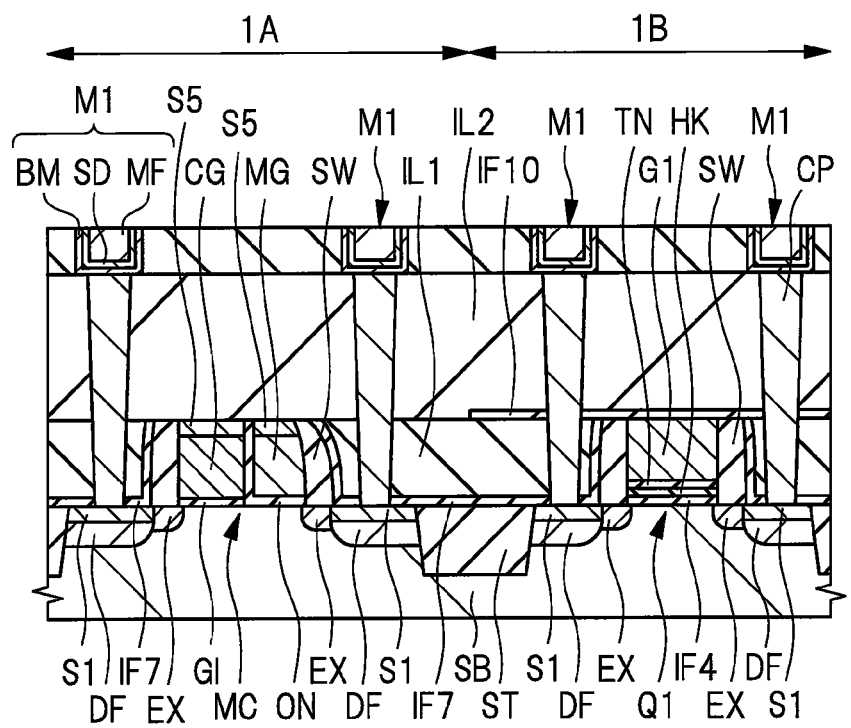
FIG. 39 is a cross-sectional view showing the manufacturing process of the semiconductor device continued from FIG. 38.

Next, as shown in FIG. 39, by carrying out the processes described with reference to FIG. 24 to FIG. 27, the semiconductor device according to the present modified example can be manufactured.

In this modified example, the silicide layer S5 (see FIG. 38) is formed by carrying out the silicidation process, with the control gate electrode CG and the memory gate electrode MG being covered with the thin silicide layer S4 shown in FIG. 37. Therefore, since it is possible to prevent the short-circuit and the reduction in withstand voltage due to the diffusion of silicon into the metal film MF2 (see FIG. 37) deposited to form the silicide layer S5 and the scattering of silicon at the time of sputtering, the reliability of the semiconductor device can be improved.

Moreover, in the above-mentioned modified example, the silicide layer S4 is formed by carrying out the process of forming the metal film MF3 shown in FIG. 35, the heat treatment process and the process of removing the metal film MF3. Alternatively, the silicide layer S4 may be formed during the sputtering process for forming the metal film MF2 (see FIG. 37) and the silicide layer S5 (see FIG. 38) may be subsequently formed without carrying out these processes. This is realized by carrying out a chemical dry etching process at a comparatively high temperature as a pretreatment process for the metal film MF2.

In other words, in the process described with reference to FIG. 32, the chemical dry etching process is carried out as the pretreatment process for forming the metal film MF2 after forming the gate electrode G1 and the insulating film IF10. Thus, impurities on the upper surfaces of the interlayer insulating film IL1, the control gate electrode CG, the memory gate electrode MG and the like are removed. In this chemical dry etching, the semiconductor wafer, that is, the semiconductor substrate SB and the structure thereon are heated at 100 to 200° C. Thereafter, a sputtering process is carried out so as to deposit the metal film MF2 on the interlayer insulating film IL1.

The semiconductor wafer during this sputtering process maintains a comparatively high temperature of, for example, less than 70° C. because of the influence of heating by the chemical dry etching carried out immediately before. For this reason, the metal film deposited at the initial stage of the sputtering and silicon are reacted with each other by the heat, so that the silicide layer S4 (see FIG. 37) is formed on the upper surfaces of the control gate electrode CG and the memory gate electrode MG. Therefore, it is possible to prevent silicon of the upper surfaces of the control gate electrode CG and the memory gate electrode MG from scattering during the subsequent sputtering carried out thereafter.

By carrying out the sputtering process in the above-described manner, as shown in FIG. 37, the metal film MF2 is formed on the control gate electrode CG and the memory gate electrode MG, with the silicide layer S4 interposed therebetween. By carrying out the processes described with reference to FIG. 38 and FIG. 39 as the subsequent processes, the semiconductor device including the control gate electrode CG and the memory gate electrode MG whose upper surfaces are covered with the silicide layer S5 can be manufactured.

In this case, since the formation process of the metal film MF3 (see FIG. 35), the heating process for forming the silicide layer S4 and the removing process of the metal film MF3 can be omitted like the above-mentioned modified example, the manufacturing process can be simplified. Therefore, the manufacturing cost of the semiconductor device can be reduced.

Third Embodiment

Hereinafter, the case of preventing the short-circuit between the control gate electrode and the memory gate electrode and the reduction in withstand voltage between these gate electrodes by retreating the upper surfaces of the gate electrodes unlike the first embodiment will be described with reference to FIG. 40 to FIG. 43. FIG. 40 to FIG. 43 are cross-sectional views for describing the manufacturing process of a semiconductor device according to the present embodiment. FIG. 40 to FIG. 43 show the memory cell region 1A and the peripheral circuit region 1B in the same manner as FIG. 1 and the like.

Figure 40:
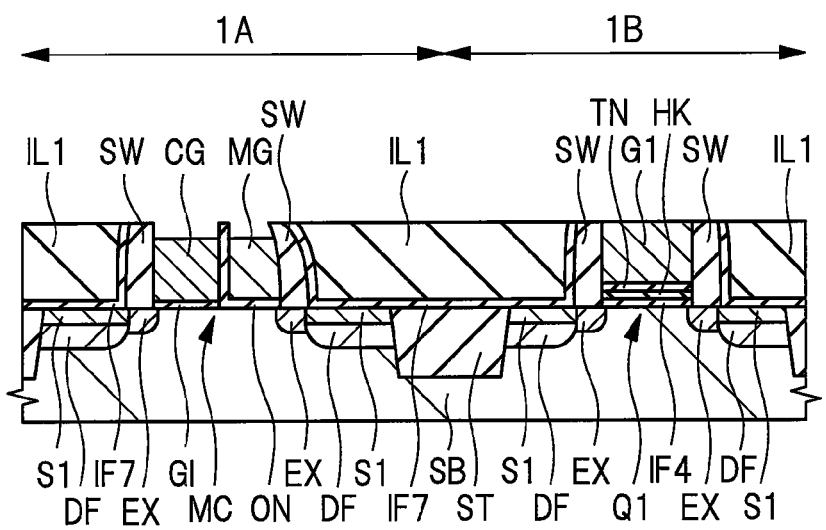
FIG. 40 is a cross-sectional view showing a manufacturing process of a semiconductor device according to the third embodiment.

In the manufacturing process in the present embodiment, the process described with reference to FIG. 31 is first carried out and the processes described with reference to FIG. 18 to FIG. 21 are then carried out. Thereafter, the upper surfaces of the control gate electrode CG and the memory gate electrode MG are retreated toward the main surface of the semiconductor substrate SB by carrying out a dry etching process as shown in FIG. 40.

In this case, a dry etching process having a selectivity relative to the ONO film ON is carried out. Therefore, the height of the upper surfaces of the control gate electrode CG and the memory gate electrode MG becomes lower than the height of the upper surface of the ONO film ON at the highest position. Since etch-back is executed by the dry etching process in this manner, the silicide layer S2 is removed even when the silicide layer S2 shown in FIG. 17 is formed. Therefore, the upper surfaces of the control gate electrode CG and the memory gate electrode MG are exposed after the etch-back. By this etch-back, trenches are formed on the upper surfaces of the control gate electrode CG and the memory gate electrode MG.

Next, after the insulating film IF10 is formed by carrying out the same process as the process described with reference to FIG. 22, the metal film MF2 is formed on the interlayer insulating film IL1, the control gate electrode CG, the memory gate electrode MG and the insulating film IF10. The metal film MF2 is formed to fill the above-mentioned trenches and to be in contact with the upper surfaces of the control gate electrode CG and the memory gate electrode MG.

In this case, the film is formed by using the sputtering method with a low energy (see FIG. 13), the collimated sputtering method (see FIG. 29) or the long throw sputtering method (see FIG. 30). Therefore, it is possible to prevent silicon of the upper surfaces of the control gate electrode CG and the memory gate electrode MG from scattering by the sputtering process when depositing the metal film MF2.

Figure 42:
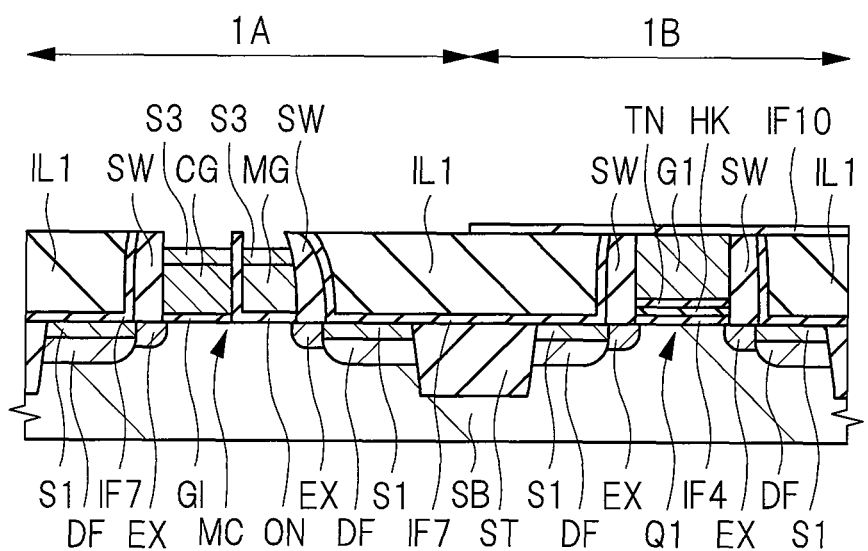
FIG. 42 is a cross-sectional view showing the manufacturing process of the semiconductor device continued from FIG. 41.

Next, as shown in FIG. 42, by carrying out the same process as the process described with reference to FIG. 23, a silicide layer S3 is formed so as to be in contact with the upper surfaces of the control gate electrode CG and the memory gate electrode MG, and thereafter, excessive metal film MF2 is removed. Since the upper surfaces of the control gate electrode CG and the memory gate electrode MG are etched back, the height of the upper surfaces of the two silicide layers S3 formed on the gate electrodes is lower than the height of the uppermost surface of the ONO film ON. Namely, even if the silicide layer S3 is formed, the above-mentioned trenches are not completely filled.

Figure 43:
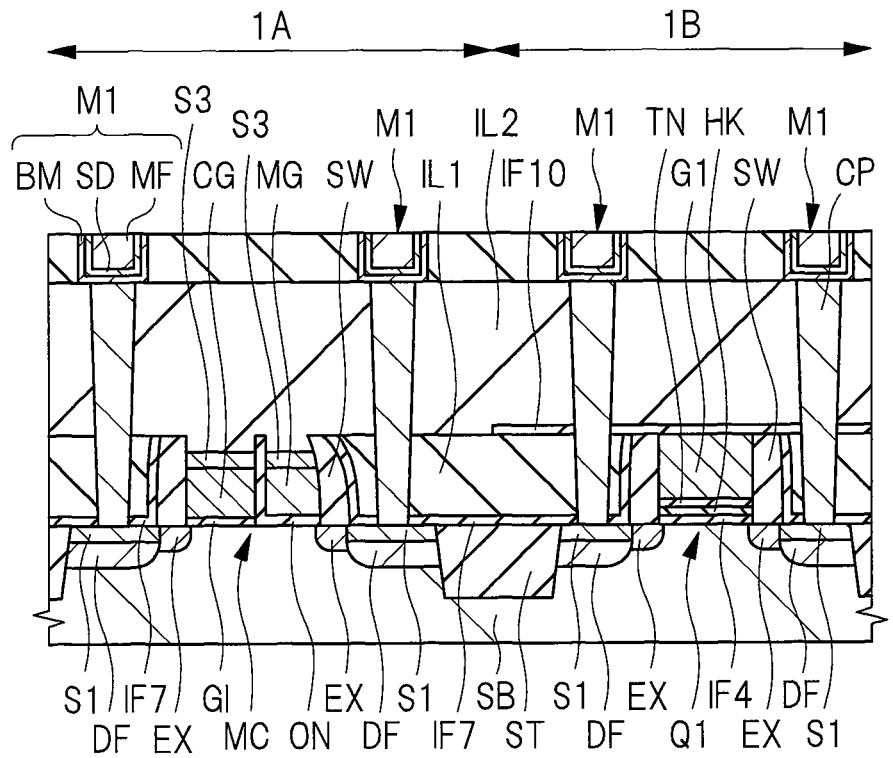
FIG. 43 is a cross-sectional view showing the manufacturing process of the semiconductor device continued from FIG. 42.

Next, as shown in FIG. 43, by carrying out the processes described with reference to FIG. 24 to FIG. 27, the semiconductor device according to the present embodiment can be manufactured.

In the present embodiment, by retreating the upper surfaces of the control gate electrode CG and the memory gate electrode MG, the insulating property between the control gate electrode CG and the memory gate electrode MG can be improved by the ONO film ON interposed between the control gate electrode CG and the memory gate electrode MG.

Namely, even if the diffusion of silicon described with reference to FIG. 49 and the scattering of silicon described with reference to FIG. 50 occur, since the ONO film ON having the upper surface whose height is higher than the control gate electrode CG, the memory gate electrode MG and the two silicide layers S3 thereon is present, the occurrence of short-circuit between these silicide layers S3 and the reduction in withstand voltage can be prevented. Therefore, the reliability of the semiconductor device can be improved.

<Modified Example>

Hereinafter, the case in which the upper surfaces of the control gate electrode and the memory gate electrode are retreated by carrying out an etch-back process and a salicide process for forming a thin silicide layer for protecting the upper surfaces of the gate electrodes is additionally carried out will be described with reference to FIG. 44 to FIG. 48. FIG. 44 to FIG. 48 are cross-sectional views for describing the manufacturing process of a semiconductor device according to the present modified example. FIG. 44 to FIG. 48 show the memory cell region 1A and the peripheral circuit region 1B in the same manner as FIG. 1 and the like.

Figure 44:
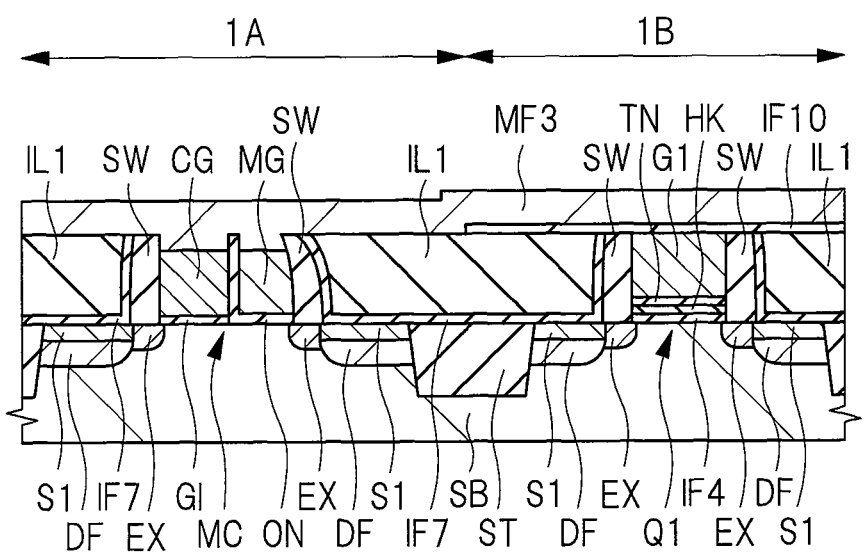
FIG. 44 is a cross-sectional view showing a manufacturing process of a semiconductor device in a modified example of the third embodiment.

In the manufacturing process of the present modified example, after carrying out the process described with reference to FIG. 40, an insulating film IF10 covering the dummy gate electrode DG is formed as shown in FIG. 44, and a metal film MF3 is subsequently formed on the semiconductor substrate SB by using the sputtering method.

The metal film MF3 is formed by using the sputtering method with a low energy (see FIG. 13), the collimated sputtering method (see FIG. 29) or the long throw sputtering method (see FIG. 30) like the metal film MF2 shown in FIG. 52. Accordingly, since no silicide layer is formed on the upper surfaces of the control gate electrode CG and the memory gate electrode MG in this case, the metal film MF3 is deposited so as to be in contact with these upper surfaces, but it is possible to prevent silicon of the upper surfaces of the control gate electrode CG and the memory gate electrode MG from scattering due to the sputtering process.

Figure 45:
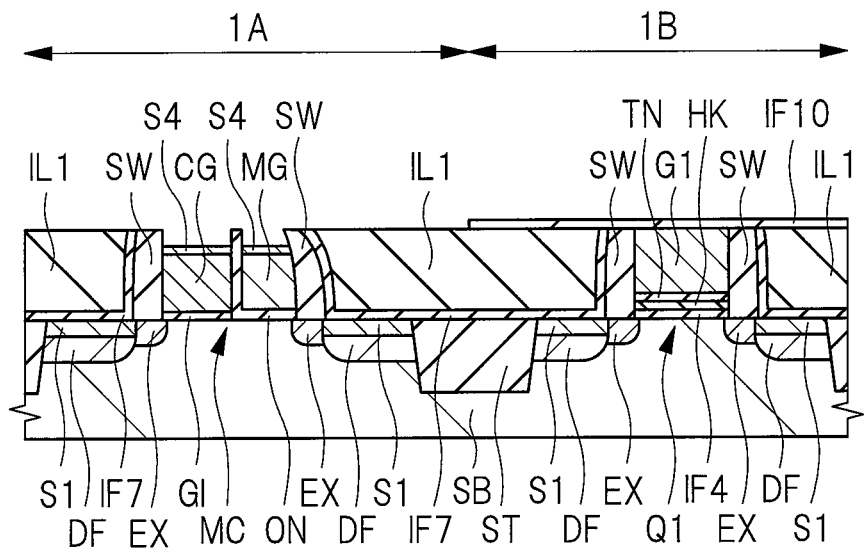
FIG. 45 is a cross-sectional view showing the manufacturing process of the semiconductor device continued from FIG. 44.

Next, as shown in FIG. 45, by heating the semiconductor substrate SB at a low temperature of less than 70° C., the metal film MF3 is reacted with silicon of the upper surfaces of the control gate electrode CG and the memory gate electrode MG, so that a thin silicide layer S4 is formed on the upper surfaces of the control gate electrode CG and the memory gate electrode MG. The film thickness of the silicide layer S4 is smaller than that of the silicide layer S1. Thereafter, unreacted excessive metal film MF3 is removed.

Figure 46:
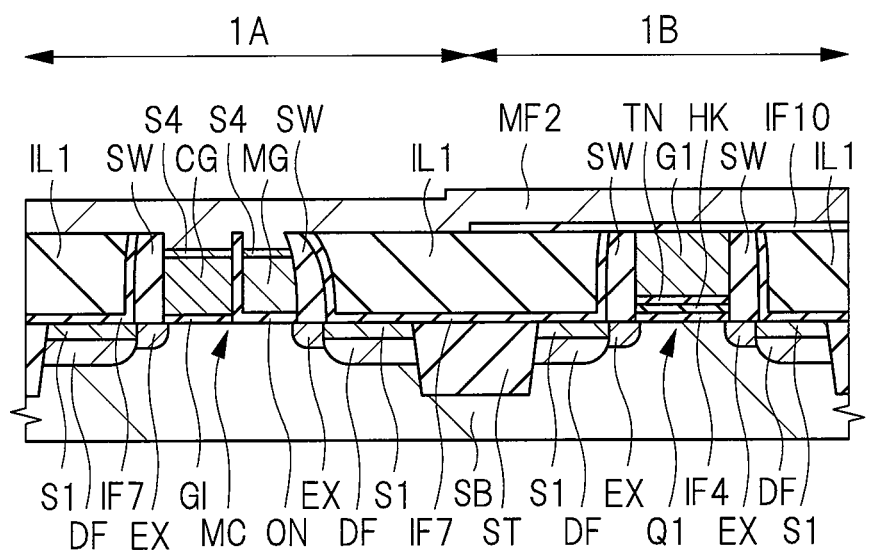
FIG. 46 is a cross-sectional view showing the manufacturing process of the semiconductor device continued from FIG. 45.

Next, as shown in FIG. 46, the same process as the process described with reference to FIG. 22 is carried out to form the metal film MF2 on the interlayer insulating film IL1. Namely, it is possible to use the sputtering method with a low energy (see FIG. 13), the collimated sputtering method (see FIG. 29) or the long throw sputtering method (see FIG. 30) in the sputtering process for forming the metal film MF2. Moreover, it is also possible to carry out the sputtering by supplying to the target TG an energy (for example, 10 to 20 kW) similar to the energy to be supplied to the target TG (see FIG. 13) when forming the metal film MF1 (see FIG. 14).

In the case of using the sputtering method with a low energy (see FIG. 13), the collimated sputtering method (see FIG. 29) or the long throw sputtering method (see FIG. 30), it is possible to prevent the silicide layer S4 from being damaged. Moreover, even when the sputtering is carried out by using a high energy of about 10 to 20 kW, since the upper surfaces of the control gate electrode CG and the memory gate electrode MG are protected by the silicide layer S4, it is possible to prevent the short-circuit and the reduction in withstand voltage due to the diffusion and scattering of silicon. In the case where the sputtering is carried out at high energy, the effect of accelerating the deposition rate of the metal film MF2 can be obtained.

Figure 47:
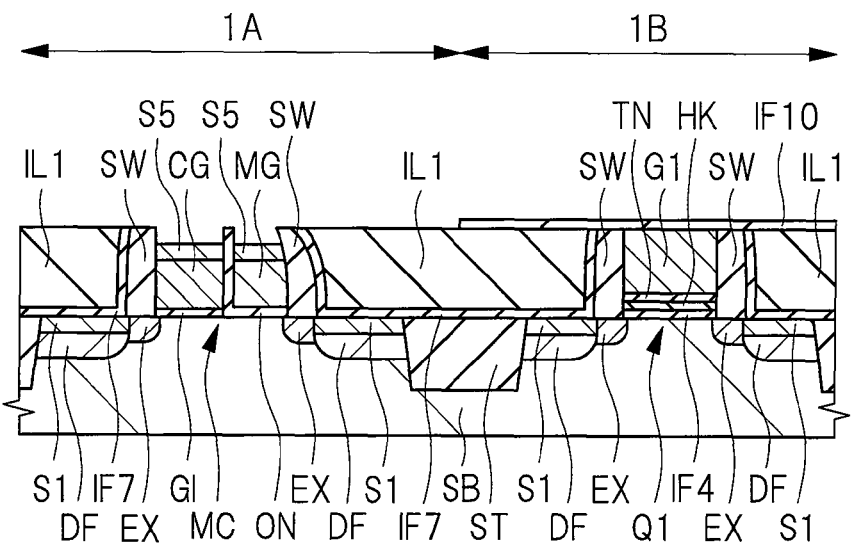
FIG. 47 is a cross-sectional view showing the manufacturing process of the semiconductor device continued from FIG. 46.

Next, as shown in FIG. 47, after forming a silicide layer S5 that is made in contact with the upper surfaces of the control gate electrode CG and the memory gate electrode MG by carrying out a silicidation process by a heat treatment, excessive metal film MF2 is removed. In this case, the silicide layer S4 is integrally formed with the silicide layer S5 and the illustration thereof is omitted. Namely, the thickness of the silicide layer S5 is larger than that of the silicide layer S4. Since the upper surfaces of the control gate electrode CG and the memory gate electrode MG are etched back, the height of the upper surfaces of the two silicide layers S5 formed on the gate electrodes is lower than the height of the uppermost surface of the ONO film ON. Namely, even when the silicide layer S5 is formed, the above-mentioned trenches are not completely filled.

Figure 48:
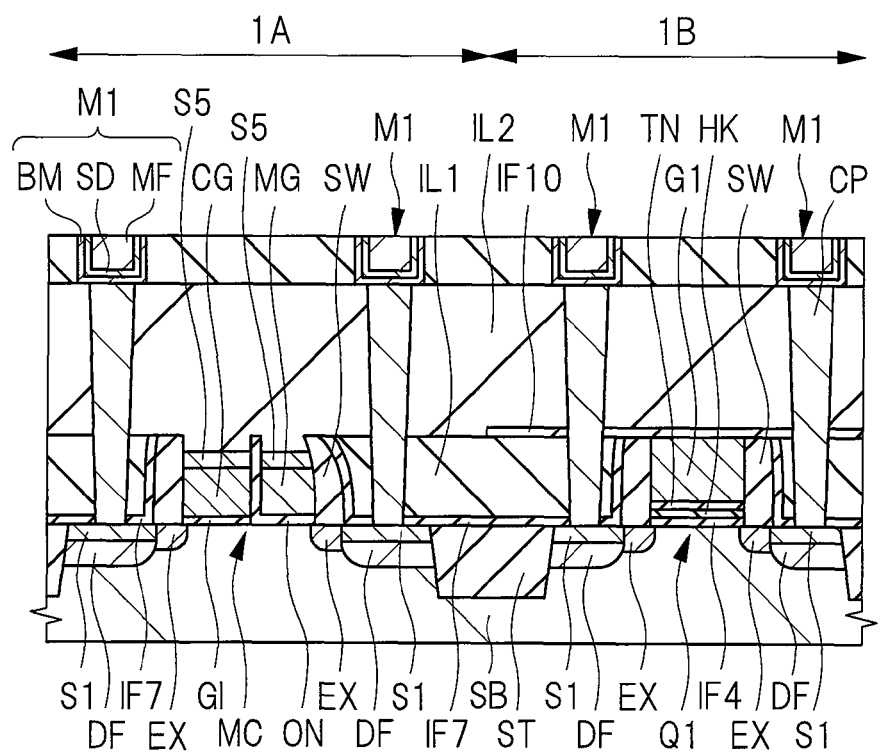
FIG. 48 is a cross-sectional view showing the manufacturing process of the semiconductor device continued from FIG. 47.

Next, as shown in FIG. 48, by carrying out the processes described with reference to FIG. 24 to FIG. 27, the semiconductor device according to the present modified example can be manufactured.

In this modified example, the silicide layer S5 (see FIG. 47) is formed by carrying out the silicidation process, with the control gate electrode CG and the memory gate electrode MG being covered with the thin silicide layer S4 shown in FIG. 47. Therefore, since it is possible to prevent the short-circuit and the reduction in withstand voltage due to the diffusion of silicon into the metal film MF2 (see FIG. 46) deposited to form the silicide layer S5 and the scattering of silicon at the time of sputtering, the reliability of the semiconductor device can be improved.

Moreover, by retreating the upper surfaces of the control gate electrode CG and the memory gate electrode MG, the insulating property between the control gate electrode CG and the memory gate electrode MG can be improved by the ONO film ON interposed between the control gate electrode CG and the memory gate electrode MG.

Namely, the presence of the ONO film ON having the upper surface whose height is higher than the control gate electrode CG, the memory gate electrode MG and the two silicide layers S5 thereon makes it possible to prevent the occurrence of short-circuit between the silicide layers S5 and the reduction in withstand voltage. Therefore, the reliability of the semiconductor device can be improved.

Moreover, in the above-mentioned modified example, the silicide layer S4 is formed by carrying out the process of forming the metal film MF3 shown in FIG. 44, the heat treatment process and the process of removing the metal film MF3. Alternatively, the silicide layer S4 may be formed during the sputtering process for forming the metal film MF2 (see FIG. 46) and the silicide layer S5 (see FIG. 47) may be subsequently formed without carrying out these processes. This is realized by carrying out a chemical dry etching process at a comparatively high temperature as a pretreatment process for the metal film MF2.

Figure 41:
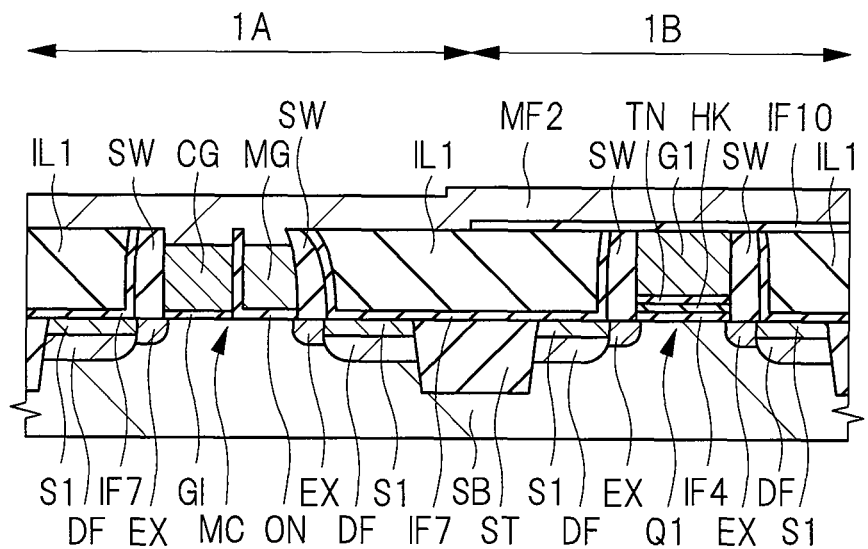
FIG. 41 is a cross-sectional view showing the manufacturing process of the semiconductor device continued from FIG. 40.

In other words, in the process described with reference to FIG. 41, the chemical dry etching process is carried out as the pretreatment process for forming the metal film MF2 after forming the gate electrode G1 and the insulating film IF10. Thus, impurities on the upper surfaces of the interlayer insulating film IL1, the control gate electrode CG, the memory gate electrode MG and the like are removed. In this chemical dry etching, the semiconductor wafer, that is, the semiconductor substrate SB and the structure thereon are heated at 100 to 200° C. Thereafter, a sputtering process is carried out so as to deposit the metal film MF2 on the interlayer insulating film IL1.

The semiconductor wafer during this sputtering process maintains a comparatively high temperature of, for example, less than 70° C. because of the influence of heating by the chemical dry etching carried out immediately before. For this reason, the metal film deposited at the initial stage of the sputtering and silicon are reacted with each other by the heat, so that the silicide layer S4 (see FIG. 46) is formed on the upper surfaces of the control gate electrode CG and the memory gate electrode MG. Therefore, it is possible to prevent silicon of the upper surfaces of the control gate electrode CG and the memory gate electrode MG from scattering during the subsequent sputtering carried out thereafter.

By carrying out the sputtering process in the above-described manner, as shown in FIG. 46, the metal film MF2 is formed on the control gate electrode CG and the memory gate electrode MG, with the silicide layer S4 interposed therebetween. By carrying out the processes described with reference to FIG. 47 and FIG. 48 as the subsequent processes, the semiconductor device including the control gate electrode CG and the memory gate electrode MG whose upper surfaces are covered with the silicide layer S5 can be manufactured.

In this case, since the formation process of the metal film MF3 (see FIG. 44), the heating process for forming the silicide layer S4 and the removing process of the metal film MF3 can be omitted like the above-mentioned modified example, the manufacturing process can be simplified. Therefore, the manufacturing cost of the semiconductor device can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device provided with a memory cell of a nonvolatile memory, comprising the steps of:
    (a) preparing a semiconductor substrate;
    (b) forming a first gate electrode formed on the semiconductor substrate with a first insulating film interposed therebetween, a second gate electrode formed on the semiconductor substrate with a second insulating film having a charge accumulation part therein interposed therebetween, and a third insulating film interposed between the first gate electrode and the second gate electrode, and then forming first source/drain regions in a main surface of the semiconductor substrate so as to sandwich the first gate electrode and the second gate electrode;
    (c) forming a first silicide layer in contact with each upper surface of the first source/drain regions and a second silicide layer in contact with an upper surface of the second gate electrode;
    (d) after the step (c), forming a first interlayer insulating film on the semiconductor substrate;
    (e) polishing the first interlayer insulating film and the second silicide layer to expose upper surfaces of the first gate electrode and the second gate electrode from the first interlayer insulating film and the second silicide layer, thereby forming a third silicide layer in contact with the upper surface of the first gate electrode and a fourth silicide layer in contact with the upper surface of the second electrode; and
    (f) after the step (e), forming a first metal film on each of the first gate electrode and the second gate electrode, and then carrying out a silicidation process by a heat treatment, thereby forming a fifth silicide layer in contact with the upper surface of the first gate electrode and a sixth silicide layer in contact with the upper surface of the second gate electrode,
    wherein the first source/drain regions, the first gate electrode, the second gate electrode and the second insulating film constitute the memory cell.

2. The manufacturing method of a semiconductor device according to claim 1,
    wherein each of the third silicide layer and the fourth silicide layer has a film thickness smaller than that of each of the fifth silicide layer and the sixth silicide layer.

3. The manufacturing method of a semiconductor device according to claim 1,
    wherein in the step (e), by carrying out the polishing process by using a slurry containing an alkaline solvent, the upper surfaces of the first gate electrode and the second gate electrode are exposed from the first interlayer insulating film and the second silicide layer, thereby forming the third silicide layer and the fourth silicide layer.

4. The manufacturing method of a semiconductor device according to claim 1, further comprising the steps of:
    (g) after the step (f), forming a second interlayer insulating film on the memory cell, and then forming a contact plug penetrating the first interlayer insulating film and the second interlayer insulating film;
    (h) forming a third interlayer insulating film having a plurality of first trenches therein on the second interlayer insulating film;
    (i) carrying out a third sputtering process, thereby forming a third metal film on the third interlayer insulating film; and
    (j) forming a fourth metal film on the third metal film, and then removing the third metal film and the fourth metal film on the third interlayer insulating film, thereby forming a wiring including the third metal film and the fourth metal film buried in each of the plurality of first trenches,
    wherein in the step (f), after forming the first metal film by carrying out a second sputtering process, the fifth silicide layer and the sixth silicide layer are formed, and
    a second power to be applied to a second target that is a sputtering object in the second sputtering process is smaller than a third power to be applied to a third target that is a sputtering object in the third sputtering process.

5. The manufacturing method of a semiconductor device according to claim 1,
    wherein in the step (b), the first insulating film, the first gate electrode, the second insulating film, the second gate electrode and the first source/drain regions are formed in a first region of the semiconductor substrate, and on the semiconductor substrate in a second region different from the first region, a dummy gate electrode is formed with a fourth insulating film interposed therebetween and second source/drain regions are formed in the main surface of the semiconductor substrate beside the dummy gate electrode,
    in the step (c), the first silicide layer, the second silicide layer and a seventh silicide layer that is in contact with each upper surface of the second source/drain regions are formed, and
    in the step (e), upper surfaces of the first gate electrode, the second gate electrode and the dummy gate electrode are exposed by polishing the first interlayer insulating film and the second silicide layer,
    the method further comprising the step of:
    (e1) after the step (e) and prior to the step (f), forming a second trench by removing the dummy gate electrode and burying a metal gate electrode into the second trench,
    wherein the second source/drain regions and the metal gate electrode constitute a field effect transistor.

6. A manufacturing method of a semiconductor device provided with a memory cell of a nonvolatile memory, comprising the steps of:
    (a) preparing a semiconductor substrate;
    (b) forming a first gate electrode formed on the semiconductor substrate with a first insulating film interposed therebetween, a second gate electrode formed on the semiconductor substrate with a second insulating film having a charge accumulation part therein interposed therebetween, and a third insulating film interposed between the first gate electrode and the second gate electrode, and then forming first source/drain regions in a main surface of the semiconductor substrate so as to sandwich the first gate electrode and the second gate electrode;

(c) forming a first silicide layer in contact with each upper surface of the first source/drain regions;

(d) after the step (c), forming a first interlayer insulating film on the semiconductor substrate;

(e) polishing the first interlayer insulating film to expose upper surfaces of the first gate electrode and the second gate electrode from the first interlayer insulating film;

(f) after the step (e), forming a first metal film on each of the first gate electrode and the second gate electrode, and then carrying out a silicidation process by a heat treatment, thereby forming a second silicide layer in contact with the upper surface of the first gate electrode and a third silicide layer in contact with the upper surface of the second gate electrode; and (g) after the step (f), forming a second metal film on each of the first gate electrode and the second gate electrode, and then carrying out a silicidation process by a heat treatment, thereby forming a fourth silicide layer in contact with the upper surface of the first gate electrode and a fifth silicide layer in contact with the upper surface of the second gate electrode, wherein the first source/drain regions, the first gate electrode, the second gate electrode and the second insulating film constitute the memory cell, and each of the second silicide layer and the third silicide layer has a film thickness smaller than that of each of the fourth silicide layer and the fifth silicide layer.

7. The manufacturing method of a semiconductor device according to claim 6, further comprising the step of:

(e1) after the step (e) and prior to the step (f), retreating each upper surface of the first gate electrode and the second gate electrode toward the main surface of the semiconductor substrate.

8. The manufacturing method of a semiconductor device according to claim 6, wherein in the step (f), after forming the first metal film by carrying out a first sputtering process, the second silicide layer and the third silicide layer are formed, in the step (g), after forming the second metal film by carrying out a second sputtering process, the fourth silicide layer and the fifth silicide layer are formed, and a first power to be applied to a first target that is a sputtering object in the first sputtering process is smaller than a second power to be applied to a second target that is a sputtering object in the second sputtering process.

9. A manufacturing method of a semiconductor device provided with a memory cell of a nonvolatile memory, comprising the steps of:

(a) preparing a semiconductor substrate;

(b) forming a first gate electrode formed on the semiconductor substrate with a first insulating film interposed therebetween, a second gate electrode formed on the semiconductor substrate with a second insulating film having a charge accumulation part therein interposed therebetween, and a third insulating film interposed between the first gate electrode and the second gate electrode, and then forming first source/drain regions in a main surface of the semiconductor substrate so as to sandwich the first gate electrode and the second gate electrode;

(c) forming a first silicide layer in contact with each upper surface of the first source/drain regions;

(d) after the step (c), forming a first interlayer insulating film on the semiconductor substrate;

(e) polishing the first interlayer insulating film to expose upper surfaces of the first gate electrode and the second gate electrode from the first interlayer insulating film;

(f) after the step (e), forming a first metal film on each of the first gate electrode and the second electrode by carrying out a first sputtering process, and then carrying out a silicidation process by a heat treatment, thereby forming a second silicide layer in contact with the upper surface of the first gate electrode and a third silicide layer in contact with the upper surface of the second gate electrode;

(g) after the step (f), forming a second interlayer insulating film on the first interlayer insulating film, and then forming a contact plug that penetrates the first interlayer insulating film and the second interlayer insulating film;

(h) forming a third interlayer insulating film having a plurality of trenches therein on the second interlayer insulating film;

(i) forming a third metal film on the third interlayer insulating film by carrying out a second sputtering process; and (j) forming a fourth metal film on the third metal film, and then removing the third metal film and the fourth metal film on the third interlayer insulating film, thereby forming a wiring including the third metal film and the fourth metal film buried in each of the plurality of the trenches, wherein a first power to be applied to a first target that is a sputtering object in the first sputtering process is smaller than a second power to be applied to a second target that is a sputtering object in the second sputtering process.

10. The manufacturing method of a semiconductor device according to claim 9, further comprising the step of:

(e1) after the step (e) and prior to the step (f), retreating each upper surface of the first gate electrode and the second gate electrode toward the main surface of the semiconductor substrate.

11. The manufacturing method of a semiconductor device according to claim 9, wherein in the step (f), after the first metal film is formed by carrying out the first sputtering, with a porous plate having a plurality of through holes extending in a direction perpendicular to the main surface of the semiconductor substrate being disposed between the first target and the semiconductor substrate, the second silicide layer and the third silicide layer are formed.

12. The manufacturing method of a semiconductor device according to claim 9, wherein a distance between the first target and the semiconductor substrate in the first sputtering process is larger than a distance between the second target and the semiconductor substrate in the second sputtering process.

* * * * *